US012603208B2

(12) United States Patent
Ma et al.

(10) Patent No.: US 12,603,208 B2
(45) Date of Patent: Apr. 14, 2026

(54) MAGNETIC SNAP-ON INTELLIGENT QUICK CONNECTION SYSTEM

(71) Applicant: GR Xplore LLC, Dover, DE (US)

(72) Inventors: Wenhong Ma, Dover, DE (US); Lei Luo, Dover, DE (US); Lei Liu, Dover, DE (US); Min Zeng, Dover, DE (US)

(73) Assignee: GR Xplore LLC, Dover, DE (US)

( * ) Notice: Subject to any disclaimer, the term of this patent is extended or adjusted under 35 U.S.C. 154(b) by 0 days.

(21) Appl. No.: 19/409,745

(22) Filed: Dec. 5, 2025

(65) Prior Publication Data
US 2026/0088205 A1 Mar. 26, 2026

(51) Int. Cl.
| | |
|---|---|
| *H01F 7/08* | (2006.01) |
| *B62J 50/21* | (2020.01) |
| *H05K 7/02* | (2006.01) |

(52) U.S. Cl.
CPC ............ *H01F 7/081* (2013.01); *B62J 50/225* (2020.02); *H05K 7/02* (2013.01)

(58) Field of Classification Search
CPC ........... H01F 7/081; B62J 50/225; H05K 7/02
USPC ........................................................ 335/289
See application file for complete search history.

(56) References Cited

U.S. PATENT DOCUMENTS

| | | | | |
|---|---|---|---|---|
| 2002/0050047 A1* | 5/2002 | Bekkevold | .............. | F16L 37/62 |
| | | | | 29/429 |
| 2009/0050451 A1* | 2/2009 | Sorensen | ................ | F16H 25/20 |
| | | | | 200/61.85 |
| 2013/0300108 A1* | 11/2013 | Frick | ........................ | F16L 37/62 |
| | | | | 285/305 |
| 2017/0325557 A1* | 11/2017 | Bemis | .................... | H01F 7/0263 |
| 2018/0294830 A1* | 10/2018 | Osmanski | ............... | H04M 1/04 |
| 2025/0197176 A1* | 6/2025 | Mebus | .................... | B66C 23/40 |

* cited by examiner

*Primary Examiner* — Shawki S Ismail
*Assistant Examiner* — Lisa N Homza
(74) *Attorney, Agent, or Firm* — Birchwood IP

(57) ABSTRACT

The present disclosure belongs to the field of mobile device mount technology, in particular to a magnetic snap-on intelligent quick connection system, comprising a device connection module including a circular base, an annular magnet array, and a quick-release fastener; the base being provided with a circular mounting slot. The present disclosure achieves great convenience by using a complete circular docking system formed by the circular base, the circular mounting slot, and the circular central hole of the device connection module, and the circular device and the frustum of the mount connection module, eliminating the need for precise angle matching during magnetic alignment. The annular magnet array and corresponding magnet groups generate uniform attraction at any angle, allowing the frustum to automatically align and insert into the central hole. Then the latches accurately dock with the snap-fit locating slots to lock in place by 360-degree arbitrary rotation.

21 Claims, 39 Drawing Sheets

Quick-release fastener 103 is capable of rotating counterclockwise to achieve 360-degree arbitrary rotation Quick-release fastener 103 is capable of rotating clockwise to achieve 360-degree arbitrary rotation Quick-release fastener 103 is capable of rotating counterclockwise to achieve 360-degree arbitrary rotation Quick-release fastener 103 is capable of rotating clockwise to achieve 360-degree arbitrary rotation Quick-release fastener 103 is capable of rotating clockwise to achieve 360-degree arbitrary rotation Quick-release fastener 103 is capable of rotating clockwise to achieve 360-degree arbitrary rotation Quick-release fastener 103 is capable of
rotating clockwise to achieve 360-degree
arbitrary rotation Quick-release fastener 103 is capable
of rotating clockwise to achieve
360-degree arbitrary rotation

MAGNETIC SNAP-ON INTELLIGENT QUICK CONNECTION SYSTEM

TECHNICAL FIELD

The present disclosure relates to the field of mobile device mount technology, in particular to a magnetic snap-on intelligent quick connection system.

BACKGROUND

In the context of increasingly widespread applications of mobile devices, the demand for mobile phone mounts for bicycles, motorcycles, and other riding equipment continues to grow. Traditional mounts usually rely on mechanical clamping or bolt locking approaches, which suffer from cumbersome assembly and disassembly processes and operational inconvenience. Although subsequently developed magnetic suction mounts have somewhat improved the assembly and disassembly experience, these existing systems typically employ a cooperative structure of rectangular holes and polygonal bosses, achieving fixation through instantaneous engagement between locking claws and undercut portions.

Such design exhibits the following inherent drawbacks: firstly, the rectangular interface necessitates maintaining a specific orientation (e.g., vertical or horizontal) during device installation, severely limiting usage flexibility; secondly, its magnetic components are typically arranged in a fixed configuration, preventing 360-degree free rotation after connection, meaning neither continuous clockwise nor counterclockwise rotation through any angle is achievable; thirdly, the unlocking mechanism often relies on a specific controller, resulting in less intuitive and convenient operation; lastly, existing solutions suffer from functional singularity, lacking effective integration with intelligent safety systems, and thus struggle to meet the higher demands for device status monitoring and safety warning in modern riding scenarios.

Therefore, in order to solve the problems, a magnetic snap-on intelligent quick connection system is provided.

SUMMARY

1. Technical Problems to Be Solved

To address the shortcomings in the prior art, the present disclosure provides a magnetic snap-on intelligent quick connection system, which solves the problems mentioned in the background art, such as directional constraints, inability to rotate and adjust, complex unlocking operations, and lack of intelligent warning functions in existing magnetic mounts.

2. Technical Solution

To achieve the above objectives, the present disclosure specifically adopts the following technical solution:

A magnetic snap-on intelligent quick connection system, comprising:

a device connection module including a circular base, an annular magnet array, and a quick-release fastener; wherein the base is provided with a circular mounting slot, the annular magnet array is fixed in the mounting slot, the quick-release fastener is fixed in the middle of the mounting slot, the quick-release fastener is provided with a circular central hole, circumferentially distributed snap-fit locating sockets, and circumferentially distributed rotating slots, the snap-fit locating sockets being located at two horizontal ends of the rotating slots;

a mount connection module including a circular device, a snap-fit locking mechanism, and a lever linkage mechanism; wherein a top of the circular device is provided with a frustum capable of being inserted into the central hole, the snap-fit locking mechanism includes two latches movably disposed in the circular device and capable of partially extending out of a side of the frustum, the lever linkage mechanism is connected to the latches;

the device connection module and the mount connection module are magnetically attracted to insert the frustum into the central hole and enable the device connection module to rotate 360 degrees arbitrarily relative to the mount connection module; when the latches are aligned with the snap-fit locating sockets, the latches are engaged to achieve mechanical locking; the lever linkage mechanism is capable of being operated to drive the latches to disengage from the latch locating sockets to achieve disassembly.

In some embodiments, the mounting slot of the base includes an outer ring slot and an inner ring slot which are concentric; the annular magnet array is embedded in the outer ring slot;

the quick-release fastener is embedded in the inner ring slot, and a foolproof structure is provided between the quick-release fastener and the inner ring slot to limit a circumferential assembly angle of the quick-release fastener.

In some embodiments, the device connection module further includes an annular magnet fixing latch and a magnet protective cover; the annular magnet fixing latch is disposed on a side of the annular magnet array away from the base;

the magnet protective cover fixedly covers the base and encapsulates the annular magnet fixing latch and the quick-release fastener;

the magnet protective cover is fixed to the base by any means of snap-fitting, ultrasonic welding, or adhesive bonding.

In some embodiments, the base is an independent circular base, and the circular base is attached to a surface of a terminal device by an adhesive backing structure;

the adhesive backing structure includes a perforated SM adhesive, a PET film, and a disc-type 3M adhesive laminated in sequence.

In some embodiments, the base is a component of a protective shell; the protective shell includes a bottom shell and a silicone outer shell, the bottom shell of the protective shell extends to a back of the silicone outer shell to form an annular boss, an inner cavity of the annular boss forms the mounting slot of the base; the protective shell is a mobile phone protective shell or a tablet computer protective shell.

In some embodiments, a buffer layer is provided on a side of the bottom shell facing the terminal device, and the buffer layer is felt or an embedded sponge block.

In some embodiments, the base is a mounting structure directly formed on a terminal device body; the terminal device is a motorcycle console or a UAV remote controller.

In some embodiments, the base is adapted to a non-circular terminal device and has an obround shape; the annular magnet array is composed of two sets of C-shaped magnets arranged opposite each other; an outer edge of the magnet protective cover is provided with symmetrical notches to make its shape consistent with the base; the non-circular terminal device is an action camera provided with an obround base for mounting the base.

In some embodiments, the quick-release fastener is made of a ceramic or metal material or engineering plastic, and magnets of the annular magnet array are arranged with alternating polarities to enhance magnetic attraction force.

In some embodiments, an intelligent safety system is integrated in the mount connection module, and the intelligent safety system includes:

a main control chip;

a gyroscope sensing module electrically connected to the main control chip and configured to detect a tilt angle of a device and generate tilt data.

a tilt alarm device electrically connected to the main control chip and configured to receive an alarm signal from the main control chip and issue a warning;

a GPS sensing module electrically connected to the main control chip and configured to receive a satellite signal to calculate precise position and speed data of the device;

a wireless communication module electrically connected to the main control chip and configured to send the position data, the speed data and device status information to a remote monitoring platform or a preset mobile terminal via a wireless network;

a power management module electrically connected to the main control chip and configured to receive external ACC power and supply power to each module; wherein the main control chip is configured to receive and process the tilt data from the gyroscope sensing module, drive the tilt alarm device to issue an alarm when the tilt angle exceeds a preset threshold; and receive position data from the GPS sensing module and send out an alarm signal containing position information through the wireless communication module.

In some embodiments, the mount connection module is a magnetic press-fit connection module which is automatically aligned with the device connection module through magnetic attraction; by pressing and extending the snap-fit locking mechanism, the latches enter the rotating slots and achieve 360-degree arbitrary rotation; during the rotation, regardless of rotating clockwise or counterclockwise to any angle, the snap-fit locking mechanism is capable of entering the corresponding snap-fit locating socket to form double-locking combining magnetic attraction and snap-fitting;

the circular device is a first circular device, and a first frustum is provided on a top of the first circular device;

the snap-fit locking mechanism is a first snap-fit locking mechanism;

the lever linkage mechanism is a first lever linkage mechanism.

In some embodiments, the first circular device includes a first upper shell, a first middle shell, and a first bottom shell arranged from top to bottom in sequence; the first frustum is bonded to a top of the first upper shell, a wireless charging control board is provided in the first middle shell, a wireless charging coil is integrated on a top of the wireless charging control board, a through hole is provided in the first middle shell, the wireless charging control board, the wireless charging coil, and the first upper shell, respectively, a waterproof sleeve is provided in the through hole of the first middle shell and the through hole of the wireless charging control board, a waterproof ring is provided between the first upper shell and the first middle shell, and a first decorative ring is embedded on the top of the first upper shell.

In some embodiments, a first annular magnet group magnetically engaged with the annular magnet array is embedded in the first upper shell, the first snap-fit locking mechanism includes two first latches symmetrically hinged to a bottom of the first middle shell through a fixing shaft, a torsion spring sleeves the fixing shaft, one end of the first latch away from the fixing shaft penetrates through a plurality of through holes and extends to a side portion of the first frustum, and a ramp located on one side of the fixing shaft is provided on one side of the first latch;

the magnetic press-fit connection module is automatically aligned with the device connection module through magnetic attraction; by pressing and extending the snap-fit locking mechanism, the latches enter the rotating slots through the torsion spring and achieve 360-degree arbitrary rotation; during the rotation, regardless of rotating clockwise or counterclockwise to any angle, the snap-fit locking mechanism is capable of entering the corresponding snap-fit locating socket to form double-locking combining magnetic attraction and snap-fitting;

a notch is provided on one side of the first bottom shell, and a power cord with one end penetrating through the first middle shell and emerging from the notch is integrated at a bottom of the wireless charging control board, a sealing ring is provided between the power cord and the first middle shell;

the first lever linkage mechanism includes a first lever body and a U-shaped slider, the U-shaped slider is slidably disposed at the bottom of the first middle shell by a slider spring, bottoms of two ends of the U-shaped slider are inclined surfaces and are respectively opposite to two ramps, the first lever body is rotatably disposed at the bottom of the first middle shell, one end of the first lever body flexibly contacts one side of the U-shaped slider, and the other end of the first lever body extends to the outside of the first middle shell and is provided with a first lever silicone sleeve.

In some embodiments, a first pressure plate located below the U-shaped slider and the first lever body is provided at the bottom of the first middle shell, a gear is rotatably provided at a middle position inside the first bottom shell, two transmission gear blocks are symmetrically arranged inside the first bottom shell, one side of the transmission gear block meshes with the gear, and the other side of the transmission gear block is provided with a gear block spring, a damping sealing gasket is embedded in the inside and the bottom of the first bottom shell, respectively, the damping sealing gasket located inside the first bottom shell contacts a bottom of the gear, and a bottom end of the gear extends to the bottom of the first bottom shell and is provided with an obround docking platform.

In some embodiments, a shock-absorbing mechanism is provided at a bottom of the first circular device, the shock-absorbing mechanism includes a shock-absorbing upper shell and a shock-absorbing lower shell, a slide slot cooperating with the obround docking platform is provided in the shock-absorbing upper shell, a shock-absorbing slide tenon is movably provided at one end of the slide slot, a locating block is provided between the slide slot and the shock-absorbing slide tenon, a plurality of shock-absorbing limiting screws with one end screwed into the inside of the shock-absorbing upper shell are provided inside the shock-absorbing lower shell, a pagoda-shaped shock-absorbing spring sleeves the shock-absorbing limiting screw, a first mount docking slot is provided at a bottom of the shock-absorbing lower shell, and a first copper nut is embedded inside the first mount docking slot.

In some embodiments, the mount connection module is a magnetic trigger connection module which is automatically aligned with the device connection module through magnetic attraction and capable of entering the rotating slot; after entering the rotating slot, the snap-fit locking mechanism is triggered, enabling the mount connection module to rotate 360 degrees arbitrarily relative to the device connection module; during the rotation, regardless of rotating clockwise or counterclockwise to any angle, the snap-fit locking mechanism is capable of entering the corresponding snap-fit locating socket to form double-locking combining magnetic attraction and snap-fitting;

the circular device is a second circular device, and a second frustum is provided on a top of the second circular device;

the snap-fit locking mechanism is a second snap-fit locking mechanism;

the lever linkage mechanism is a second lever linkage mechanism.

In some embodiments, the second circular device includes a second upper shell and a second bottom shell, the second frustum and a top of the second upper shell are integrally formed, a second annular magnet group magnetically engaged with the annular magnet array is embedded inside the second upper shell, and a second decorative ring is embedded in the top of the second upper shell;

the second snap-fit locking mechanism includes a button and two guide pressure rods symmetrically arranged on two sides of the button, a slider guide is provided on a top of the guide pressure rod, a guide spring is provided between the two slider guides, a second latch is provided on a top of the slider guide, one end of the second latch away from the slider guide extends to a side portion of the second frustum;

the magnetic trigger connection module is automatically aligned with the device connection module through magnetic attraction and capable of entering the rotating slot; after entering the rotating slot, the guide spring is triggered, enabling the mount connection module to rotate 360 degrees arbitrarily relative to the device connection module; during the rotation, regardless of rotating clockwise or counterclockwise to any angle, the snap-fit locking mechanism is capable of entering the corresponding latch locating socket to form double-locking combining magnetic attraction and snap-fitting;

a top of the button extends to a top of the second frustum, a bottom of the button is provided with a button spring, and a guide slot is provided on two sides of the bottom of the button, respectively, and a block cooperating with the guide slot is provided on one side of the slider guide.

In some embodiments, the second lever linkage mechanism includes a second lever body and a connecting rod body, the connecting rod body is rotatably disposed at a bottom of the second upper shell, the second lever body is rotatably disposed at the bottom of the second upper shell, a lever block is disposed at a rotation position of the second lever body, the lever block is located on one side of one of the guide pressure rods, one end of the connecting rod body extends to one side of the other guide pressure rod; the other end of the connecting rod body extends to one end of the second lever body and is provided with a return spring, and one end of the second lever body away from the connecting rod body extends to the outside of the second upper shell and is provided with a second lever silicone sleeve.

In some embodiments, a second pressure plate is provided inside the second bottom shell, and a plurality of arc-shaped locating slots are provided at a bottom of the second pressure plate, and the plurality of arc-shaped locating slots are arranged in a ring shape; a turntable is rotatably provided inside the second bottom shell, a turntable support is provided at a top of the turntable, a plurality of beads are movably provided inside the turntable support through bead springs, and a top of the bead extends into the inside of one of the arc-shaped locating slots;

a damping rubber ring fitting the outside of the turntable is embedded inside the second bottom shell, a plurality of dustproof nets are provided inside the second bottom shell and arranged in a ring shape, a bottom of the turntable extends to a bottom of the second bottom shell and is provided with a second mount docking slot, and a second copper nut is embedded inside the second mount docking slot.

In some embodiments, the magnetic snap-on intelligent quick connection system further comprises a mount mechanism, wherein the mount mechanism includes a vertical adjustment mount, a horizontal adjustment mount and a handlebar clamp, a top of the vertical adjustment mount is provided with a square platform cooperating with the first mount docking slot or the second mount docking slot, one end of the vertical adjustment mount and one end of the horizontal adjustment mount are locked by a first screw, and one end of the vertical adjustment mount and one end of the horizontal adjustment mount are provided with mutually meshing gear plates, and a bottom of one end of the horizontal adjustment mount away from the vertical adjustment mount is provided with a gear slot;

the handlebar clamp includes an upper clamp and a lower clamp, the upper clamp and the horizontal adjustment mount are locked by a second screw, a top of the upper clamp is provided with a circular protrusion fitting the gear slot, and the circular protrusion is provided with a plurality of locking teeth meshing with the gear slot;

one end of the lower clamp is hinged to one end of the upper clamp by a pivot, and the other end of the lower clamp and the other end of the upper clamp are locked by a third screw, and an inner liner is provided between the upper clamp and the lower clamp.

In some embodiments, the snap-fit locating socket is configured to lock the device connection module and the mount connection module;

the rotating slot is configured to guide the rotation of the mount connection module, enabling the system to lock in a plurality of horizontal directions;

the layout facilitates lever unlocking operation of the lever linkage mechanism and conforms to ergonomic principles, allowing an operator to complete unlocking and disassembly with one hand.

3. Beneficial Effects

Compared with the prior art, the present disclosure provides the magnetic snap-on intelligent quick connection system, which has the following advantages:

The present disclosure achieves great convenience by using a complete circular docking system formed by the circular base, the circular mounting slot, and the circular central hole of the device connection module, and the circular device and the frustum of the mount connection module, eliminating the need for precise angle matching during magnetic alignment. The annular magnet array and corresponding magnet groups generate uniform attraction at any angle, allowing the frustum to automatically align and insert into the central hole. Then the latches accurately dock with the snap-fit locating slots to lock in place by 360-degree arbitrary rotation. The circular design makes operation intuitive and quick, and guarantees uniform and stable force distribution at the connection interface. Combined with the wear-resistant material and optimized magnetic circuit of the quick-release fastener, it comprehensively improves the alignment efficiency, mechanical strength, and service life of the connection system.

Figure 1:
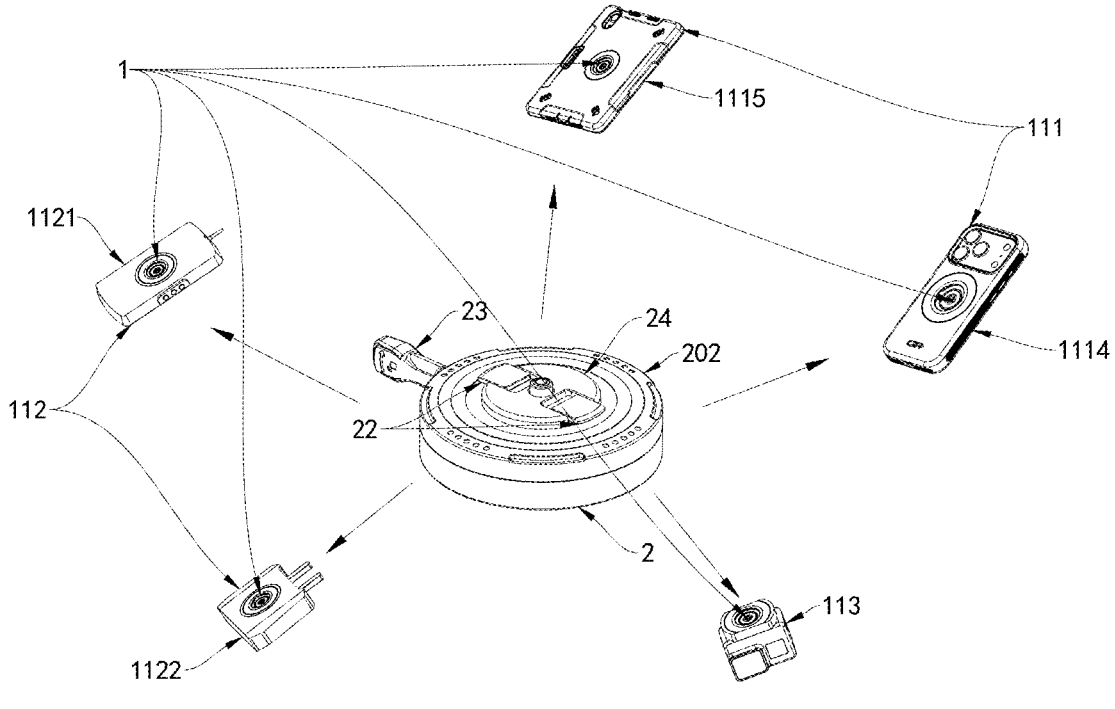
FIG. 1 is a schematic diagram showing cooperation of a magnetic trigger connection module and a device connection module according to the present disclosure.

Reference signs in the figures: 1. Device connection module; 101. Base; 102. Annular magnet array; 103. Quick-release fastener; 1031. Rotating slot; 104. Mounting slot; 1041. Outer ring slot; 1042. Inner ring slot; 1043. Foolproof structure; 105. Central hole; 106. Snap-fit locating socket; 107. Annular magnet fixing latch; 108. Magnet protective cover; 109. Circular base; 110. Adhesive backing structure; 1101. Perforated SM adhesive; 1102. PET film 1103. Disc-type 3M adhesive; 111. Protective shell; 1111. Bottom shell; 1112. Silicone outer shell; 1113. Boss; 1114. Mobile phone protective shell; 1115. Tablet computer protective shell; 1116. Buffer layer; 1117. Felt; 1118. Embedded sponge block; 112. Terminal device; 1121. Motorcycle console; 1122. UAV remote controller; 113. Non-circular terminal device; 1131. C-shaped magnet; 1132. Symmetrical notch; 1133. Action camera; 1134. Obround base; 2. Mount connection module; 201. Magnetic press-fit connection module; 202. Magnetic trigger connection module; 21. Circular device; 211. First circular device; 2111. First upper shell; 21111. First decorative ring; 21112. First annular magnet group; 2112. First middle shell; 2113. Wireless charging control board; 21131. Wireless charging coil; 21132. Power cord; 21133. Sealing ring; 2114. Through hole; 21141. Waterproof sleeve; 2115. Waterproof ring; 2116. First bottom shell; 21161. Notch; 21162. Damping sealing gasket; 2117. First pressure plate; 2118. Gear; 21181. Obround docking platform; 2119. Transmission gear block; 21191. Gear block spring; 212. Second circular device; 2121. Second upper shell; 2122. Second bottom shell; 21221. Dustproof net; 2123. Second annular magnet group; 2124. Second decorative ring; 2125. Second pressure plate; 2126. Arc-shaped locating slot; 2127. Turntable; 2128. Turntable mount; 21281. Bead spring; 21282. Bead; 2129. Damping rubber ring; 22. Snap-fit locking mechanism; 221. First snap-fit locking mechanism; 2211. Fixing shaft; 2212. Torsion spring; 222. Second snap-fit locking mechanism; 2221. Button; 2222. Guide pressure rod; 2223. Slider guide; 2224. Guide spring; 2225. Button spring; 2226. Guide slot; 2227. Block; 23. Lever linkage mechanism; 231. First lever linkage mechanism; 2311. First lever body; 2312. U-shaped slider; 2313. Slider spring; 2314. First lever silicone sleeve; 232. Second lever linkage mechanism; 2321. Second lever body; 2322. Connecting rod body; 2323. Lever block; 2324. Return spring; 2325. Second lever silicone sleeve; 24. Frustum; 241. First frustum; 242. Second frustum; 25. Latch; 251. First latch; 2511. Ramp; 2 52. Second latch; 3. Shock-absorbing mechanism; 31. Shock-absorbing upper shell; 32. Shock-absorbing lower shell; 33. Slide slot; 34. Shock-absorbing slide tenon; 35. Locating block; 36. Shock-absorbing limiting screw; 37. Pagoda-shaped shock-absorbing spring; 4. First mount docking slot; 41. First copper nut; 5. Second mount docking slot; 51. Second copper nut; 6. Mount mechanism; 61. Vertical adjustment mount; 62. Horizontal adjustment mount; 63. Handlebar clamp; 631. Upper clamp; 632. Lower clamp; 633. Circular protrusion; 634. Locking tooth; 635. Inner liner; 64. Square platform; 65. First screw; 66. Gear plate; 67. Gear slot; 68. Second screw; 69. Third screw.

DETAILED DESCRIPTION

The technical solution of the embodiments of the present disclosure will be clearly and completely described below with reference to the accompanying drawings. Obviously, the described embodiments are only some embodiments of the present disclosure, and not all embodiments. Based on the embodiments of the present disclosure, all other embodiments obtained by those skilled in the art without creative effort are within the scope of protection of the present disclosure.

Embodiments

Figure 2:
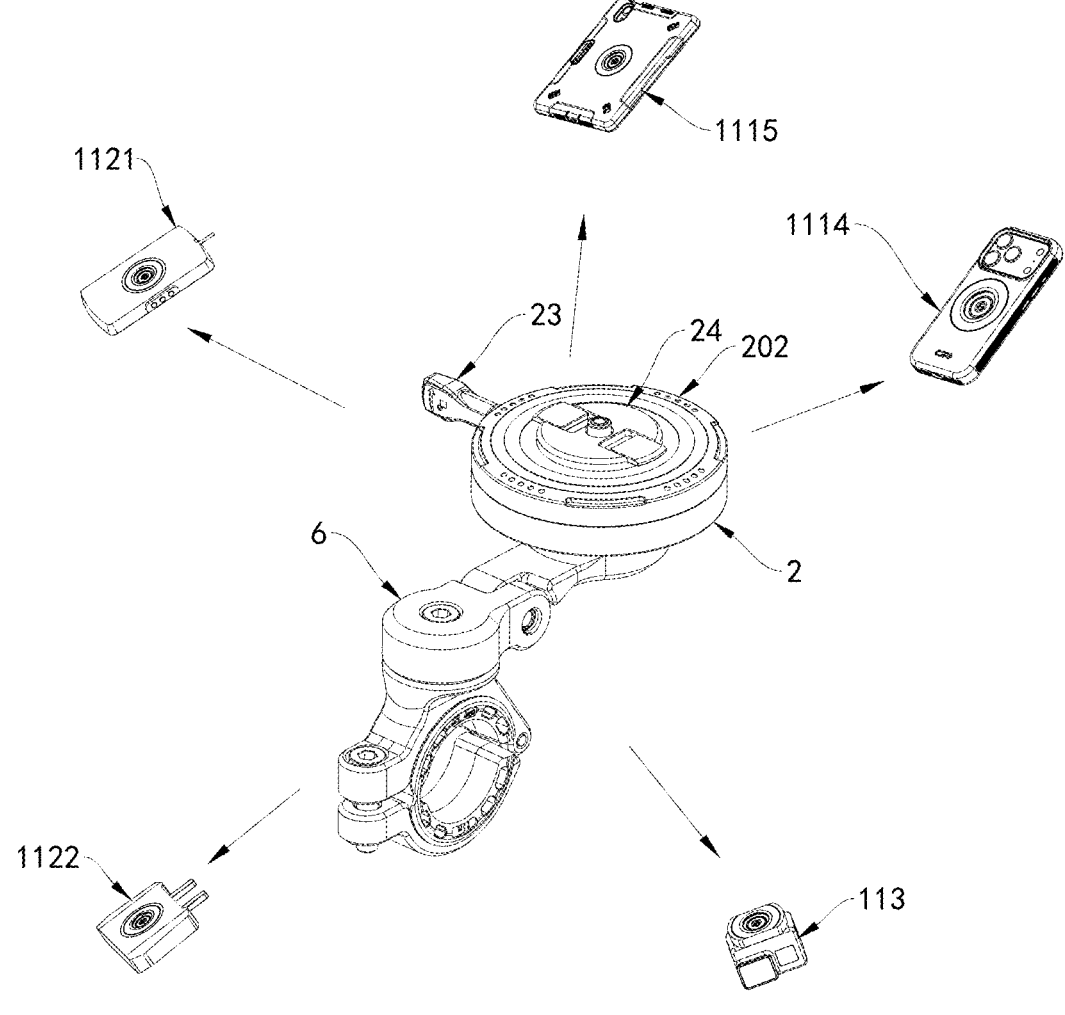
FIG. 2 is a schematic structural diagram showing a connection state of a magnetic trigger connection module and a mount mechanism according to the present disclosure.
Figure 3:
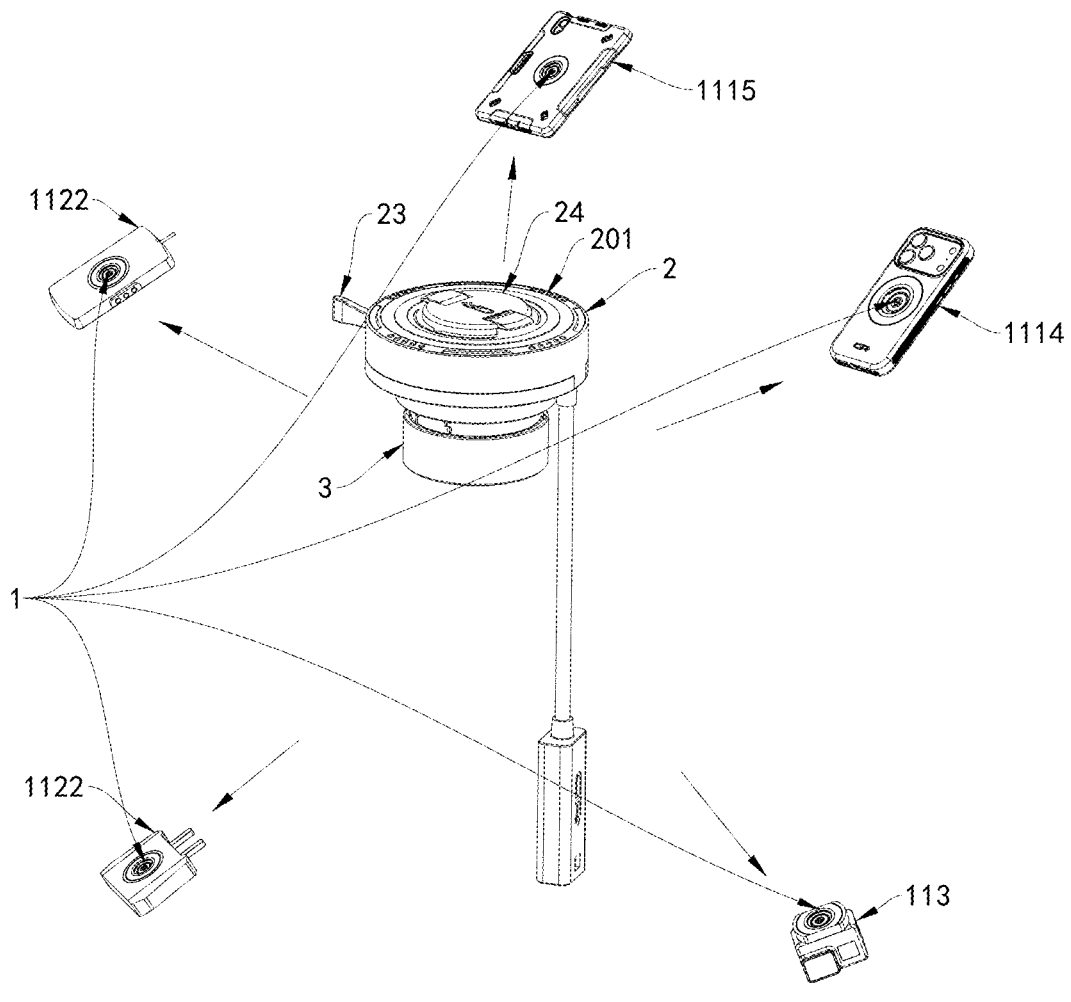
FIG. 3 is a schematic diagram showing cooperation of a magnetic press-fit connection module and a device connection module according to the present disclosure.
Figure 4:
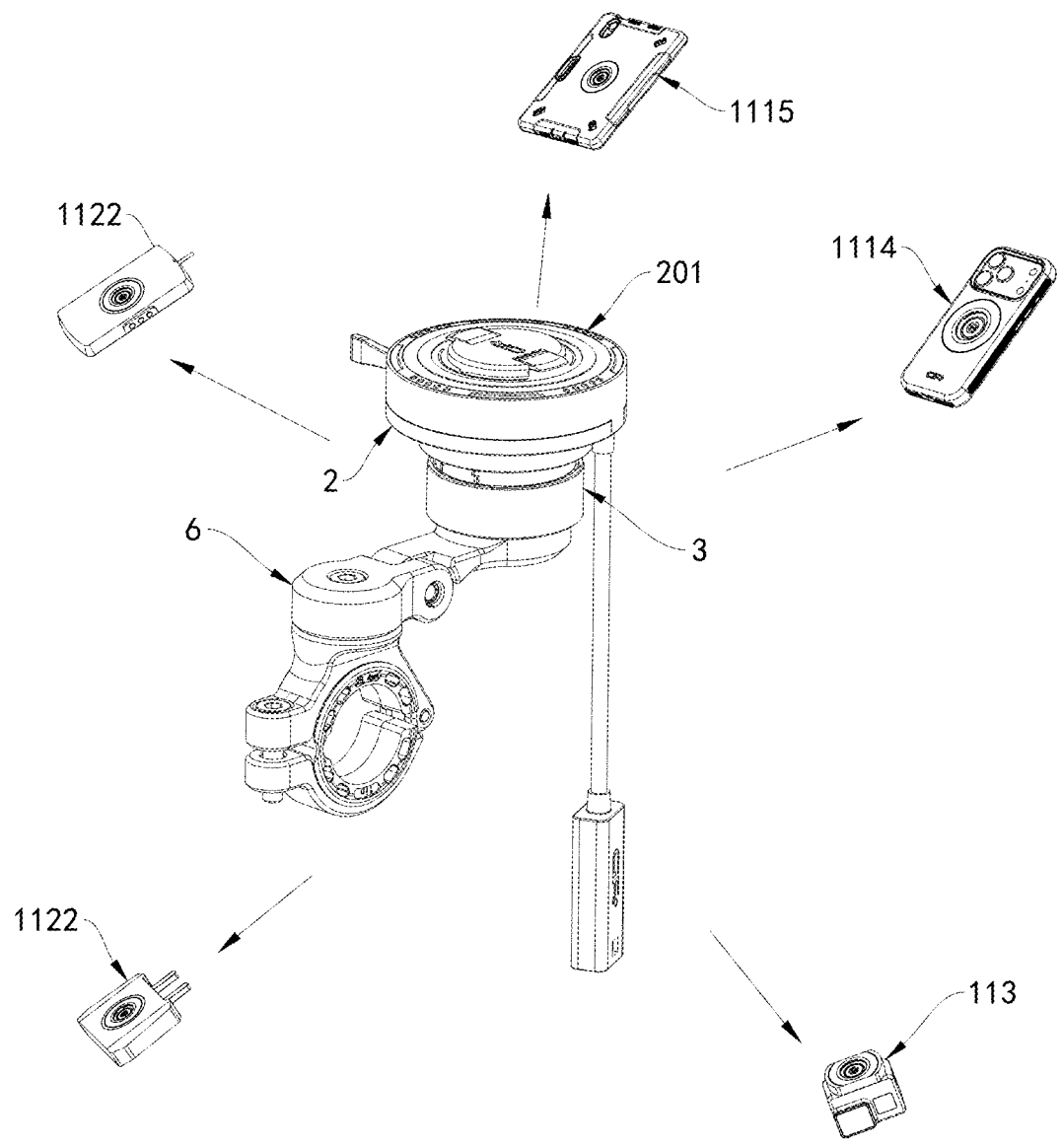
FIG. 4 is a schematic structural diagram showing a connection state of a magnetic press-fit connection module and a mount mechanism according to the present disclosure.
Figure 5:
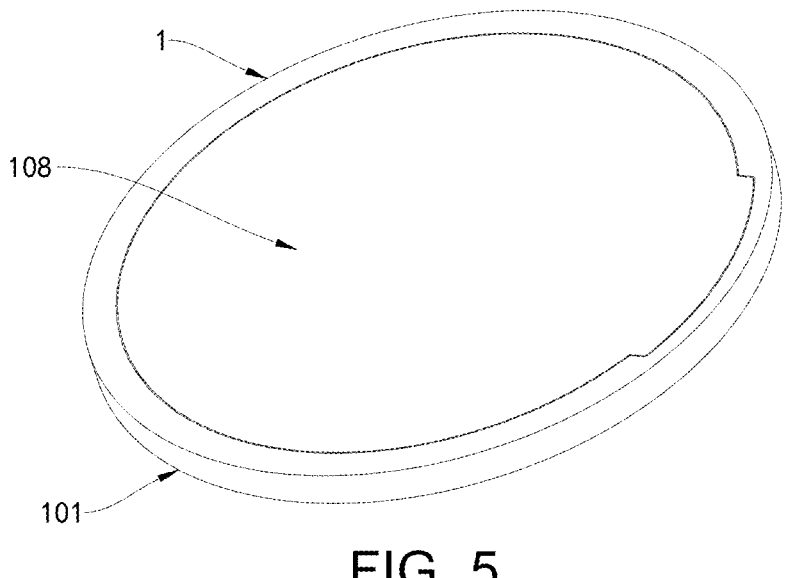
FIG. 5 is a schematic structural diagram showing a device connection module according to the present disclosure.
Figure 6:
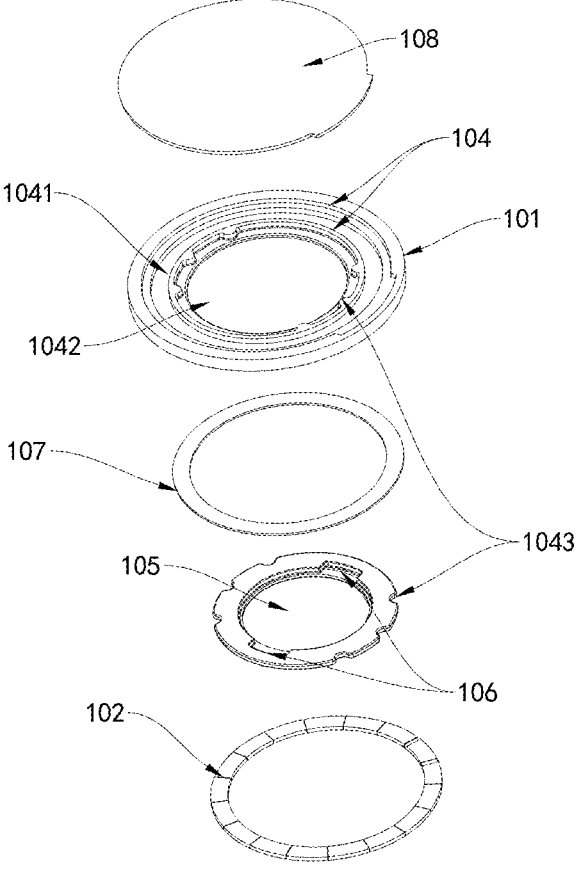
FIG. 6 is an exploded view showing a structure of a device connection module according to the present disclosure.
Figure 7:
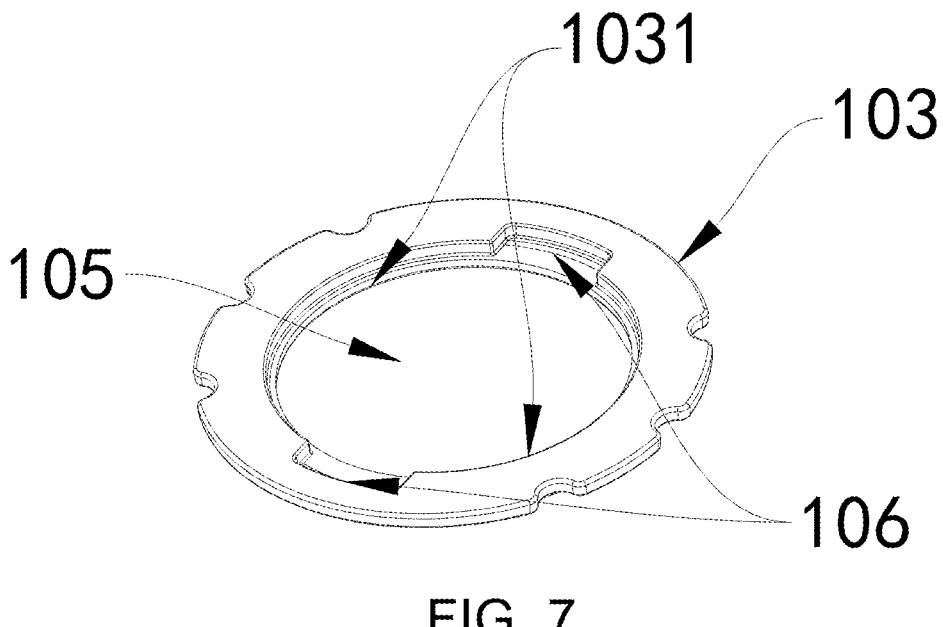
FIG. 7 is a schematic structural diagram showing a quick-release fastener of a device connection module according to the present disclosure.
Figure 8:
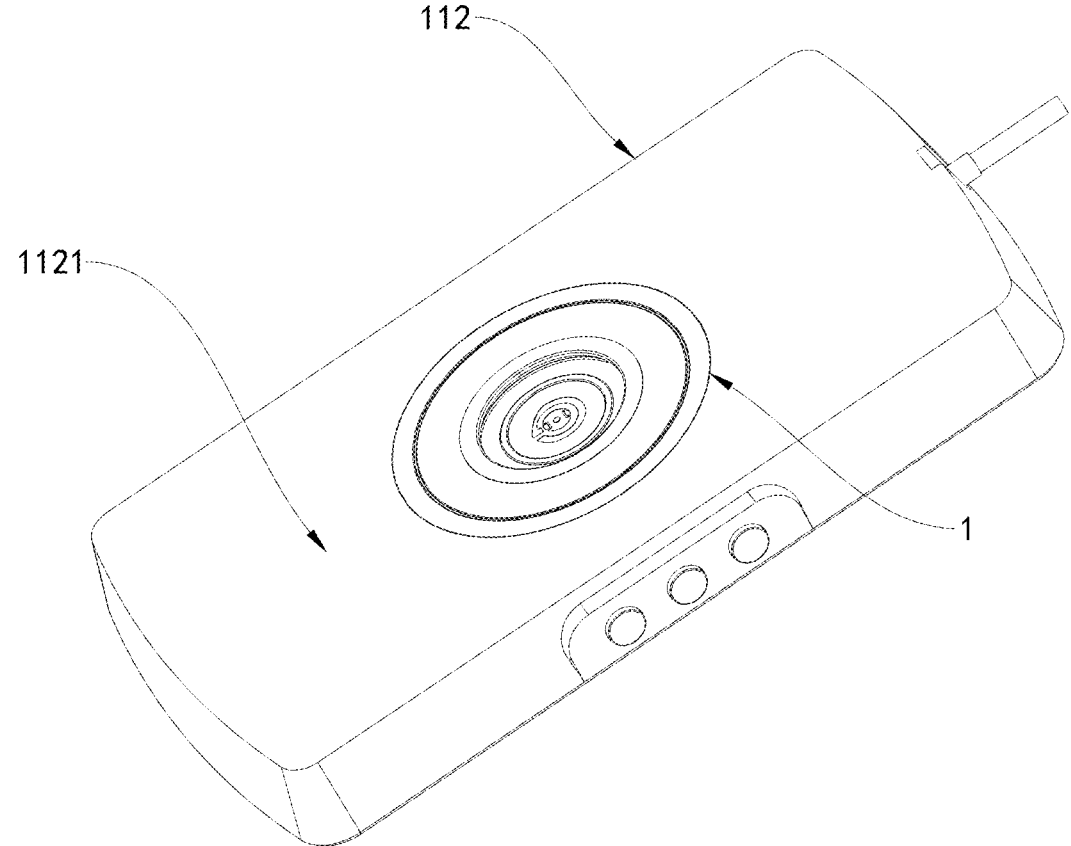
FIG. 8 is a schematic structural diagram showing a motorcycle console according to the present disclosure.
Figure 9:
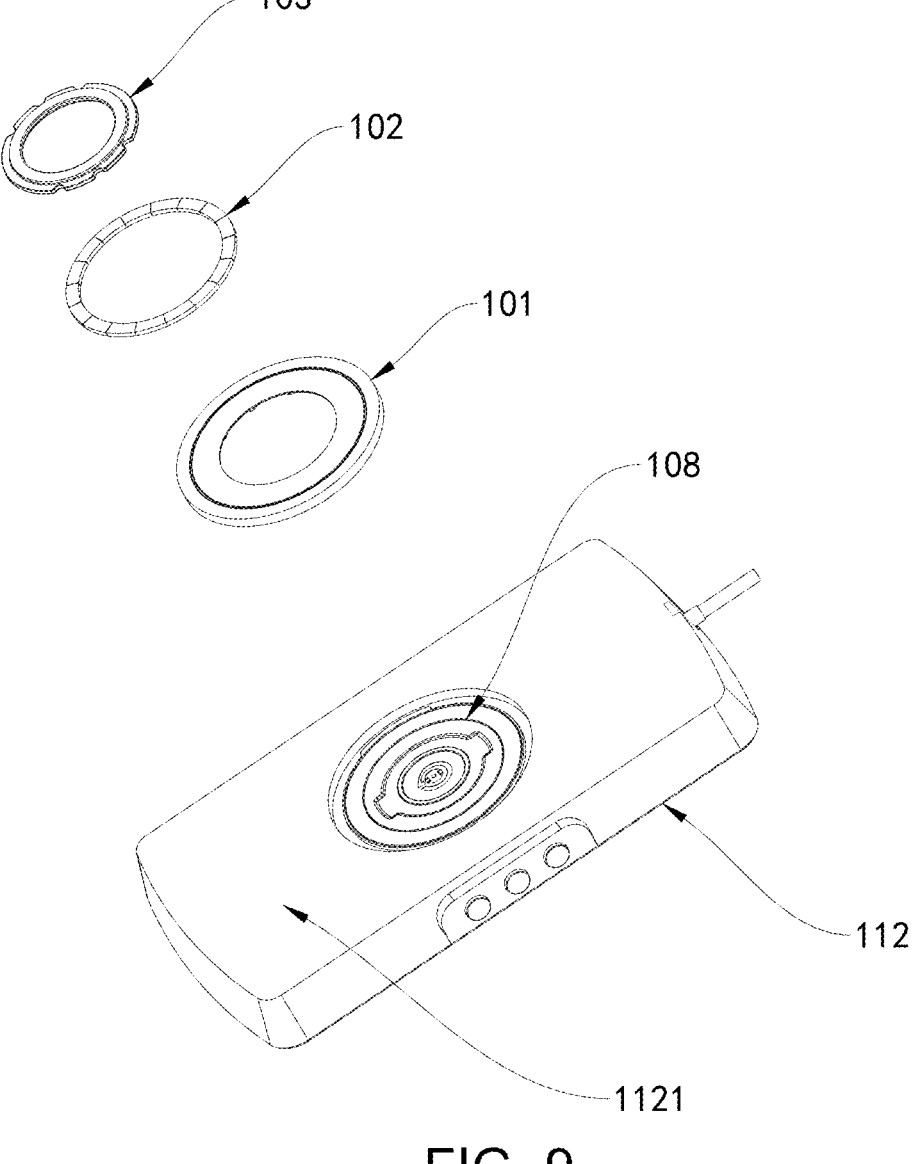
FIG. 9 is an exploded view showing a structure of a motorcycle console according to the present disclosure.
Figure 10:
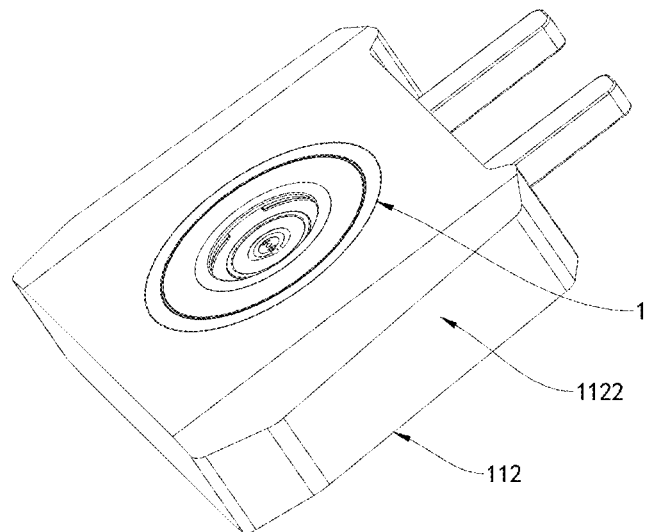
FIG. 10 is a schematic structural diagram showing a UAV remote controller according to the present disclosure.
Figure 11:
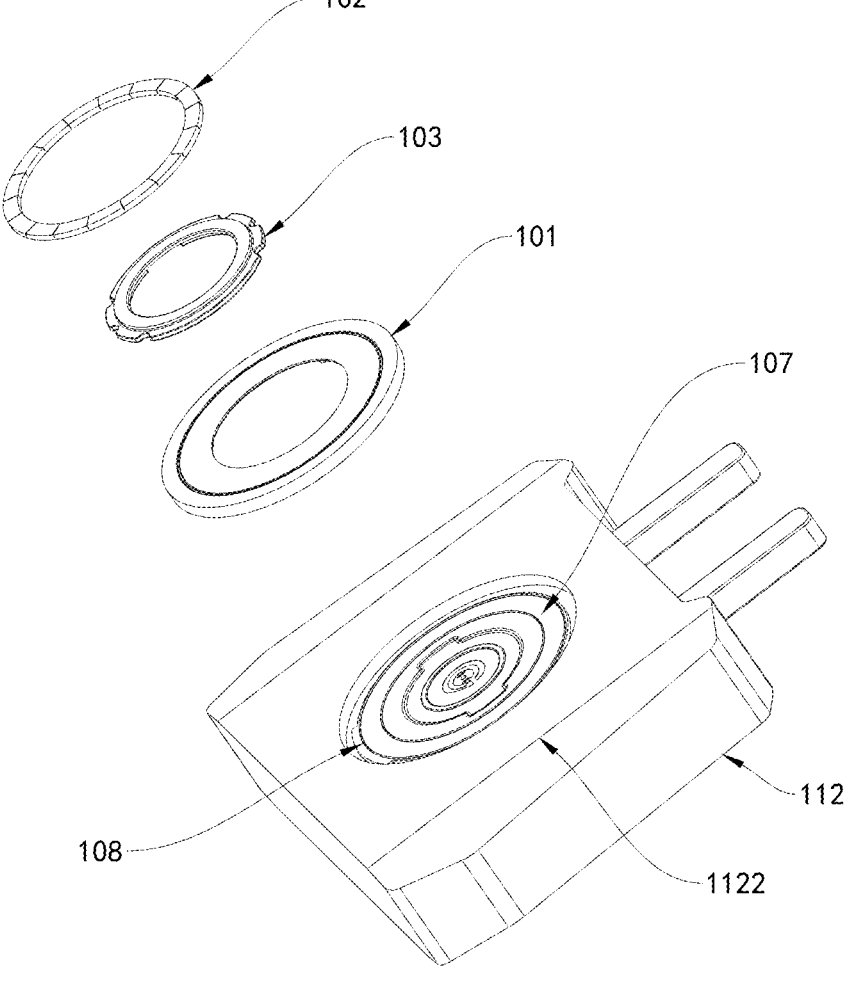
FIG. 11 is an exploded view showing a structure of a UAV remote controller according to the present disclosure.
Figure 12:
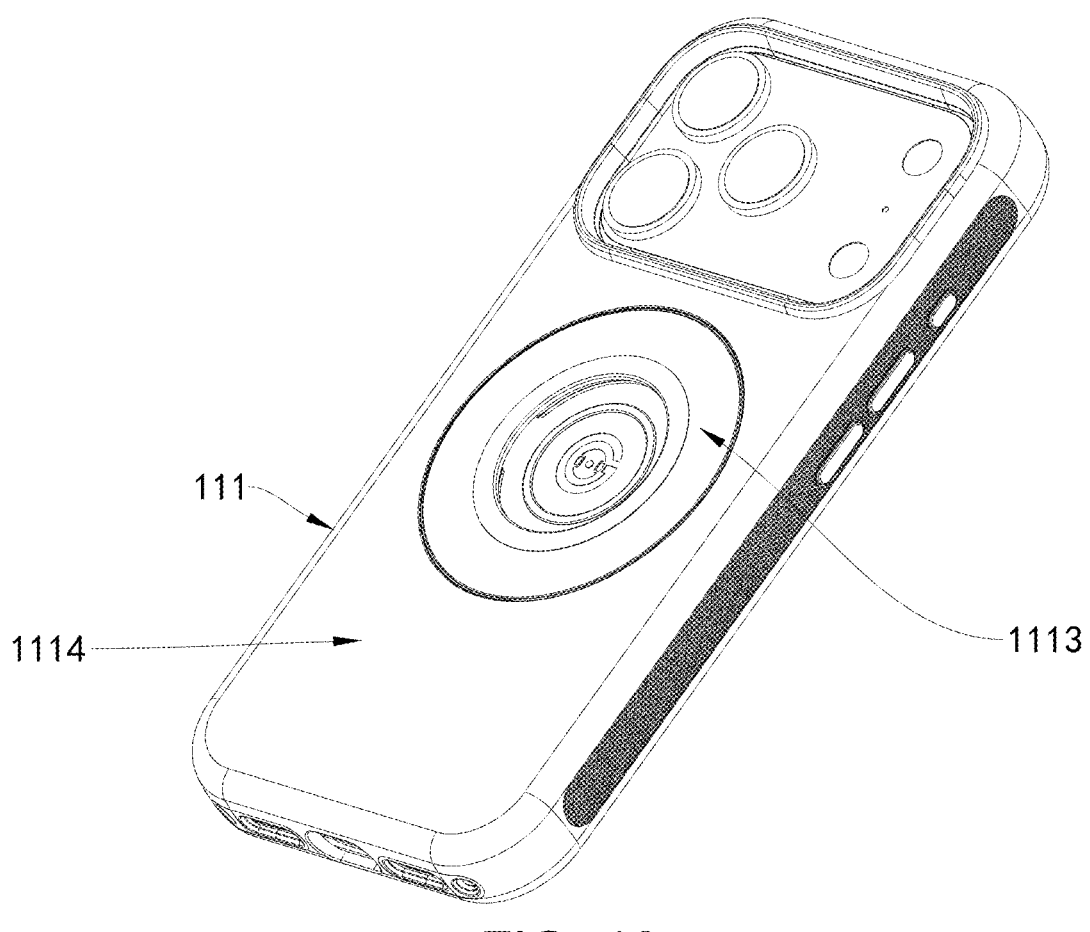
FIG. 12 is a schematic structural diagram showing a mobile phone protective shell according to the present disclosure.
Figure 13:
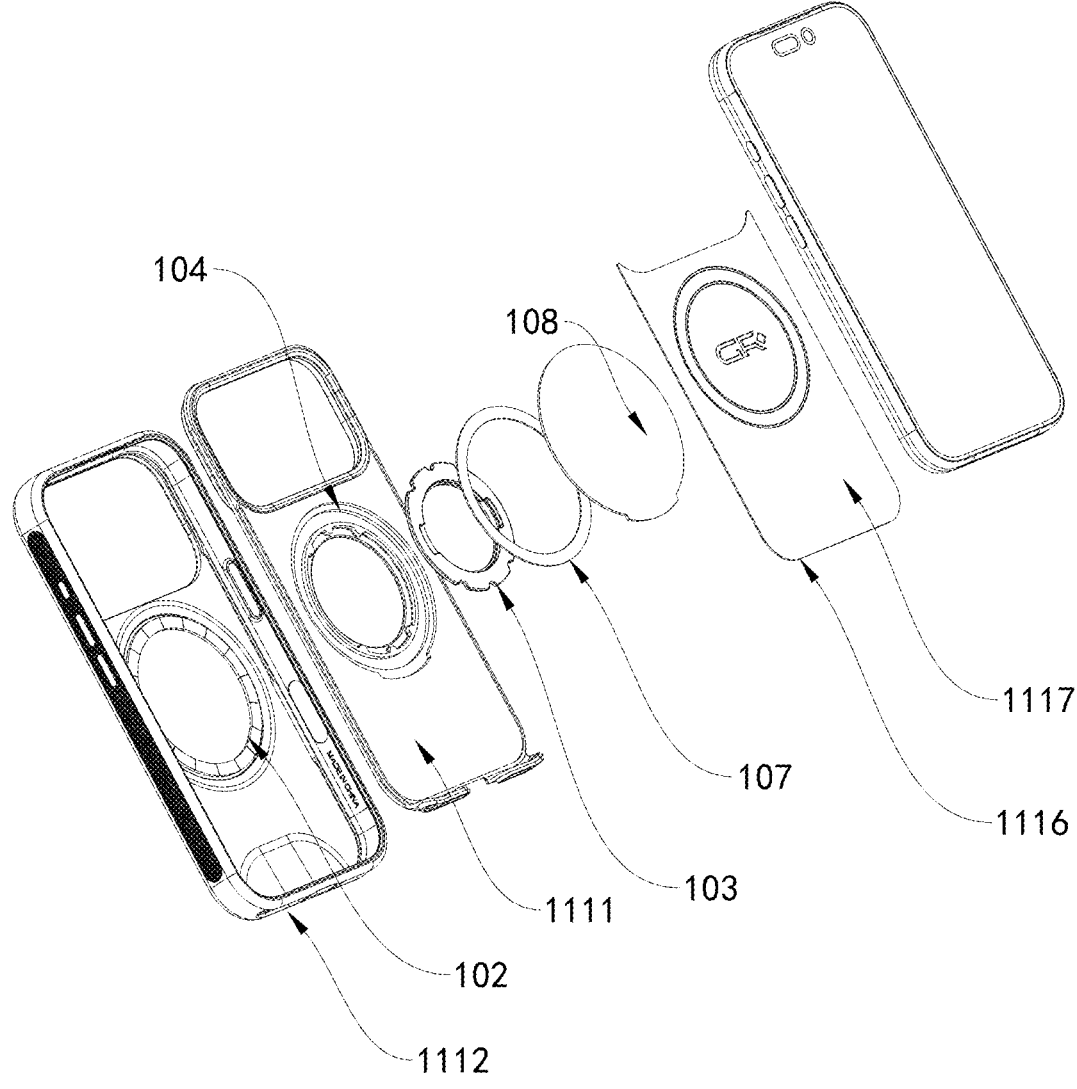
FIG. 13 is an exploded view showing a structure of a mobile phone protective shell according to the present disclosure.
Figure 14:
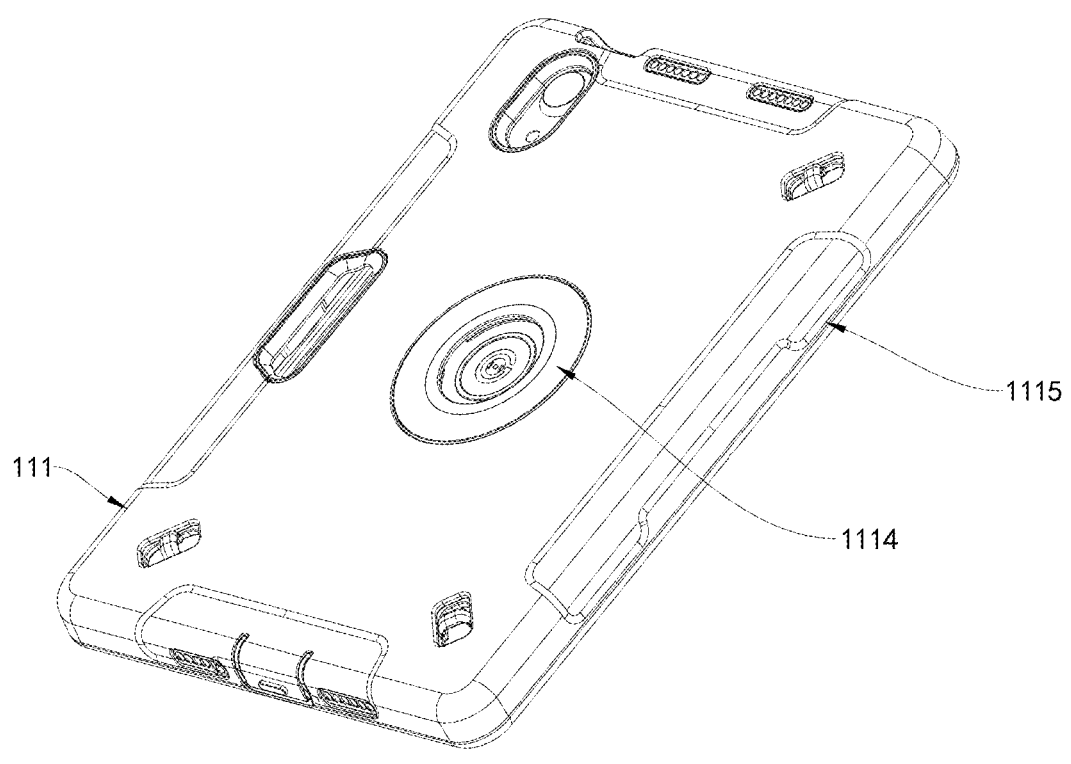
FIG. 14 is a schematic structural diagram showing a tablet computer protective shell according to the present disclosure.
Figure 15:
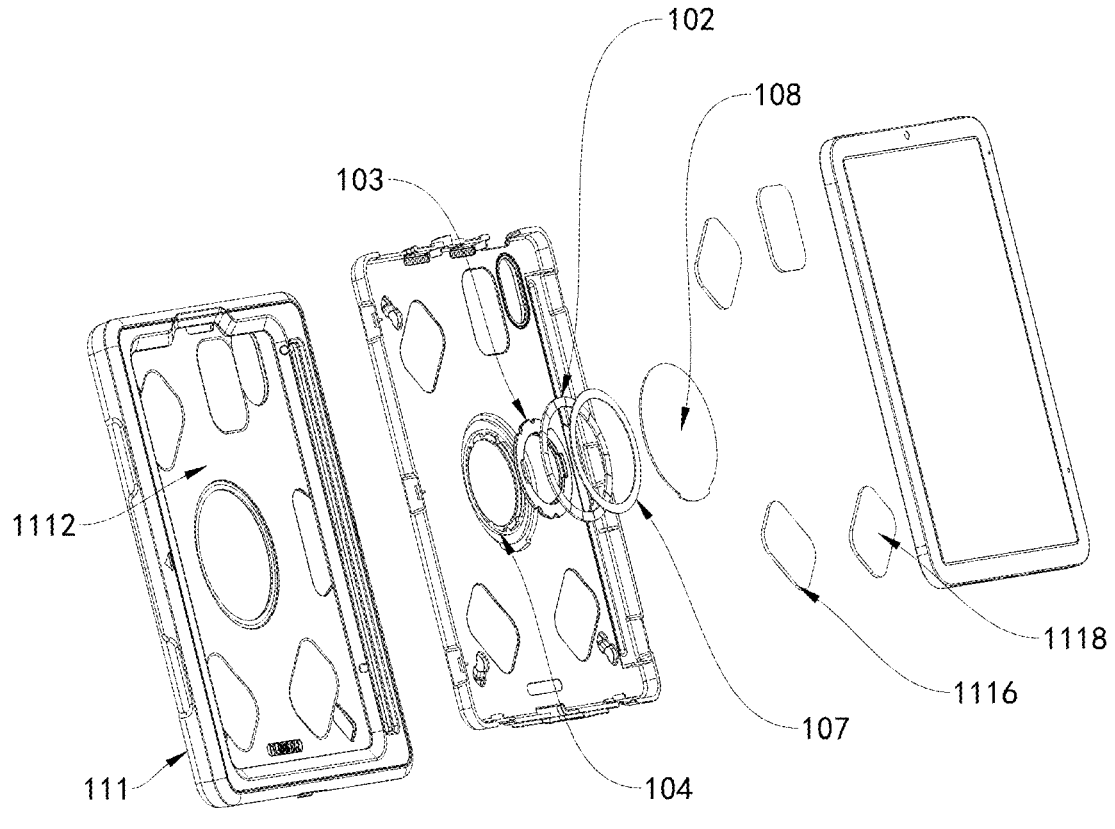
FIG. 15 is an exploded view showing a structure of a tablet computer protective shell according to the present disclosure.
Figure 16:
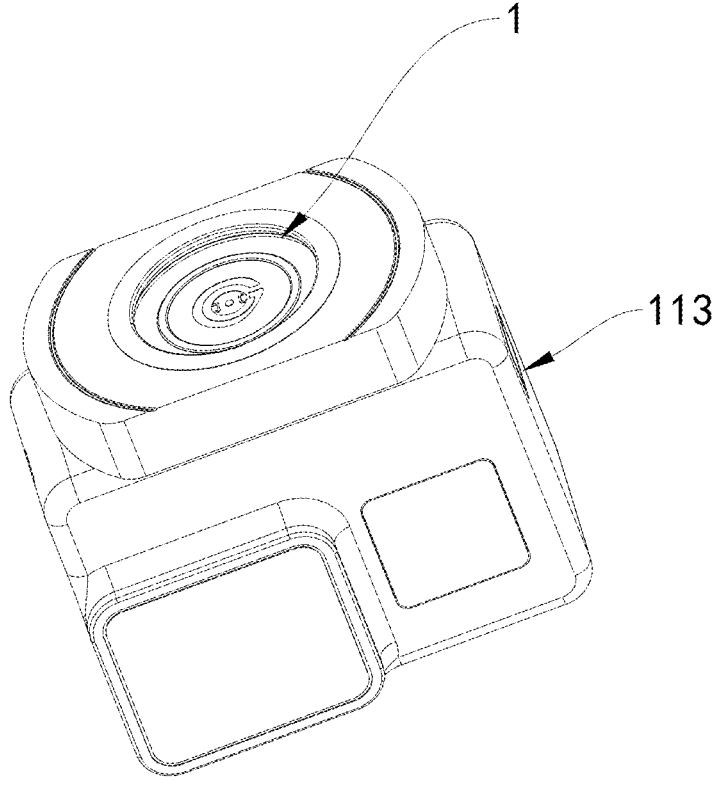
FIG. 16 is a schematic structural diagram showing an action camera according to the present disclosure.
Figure 17:
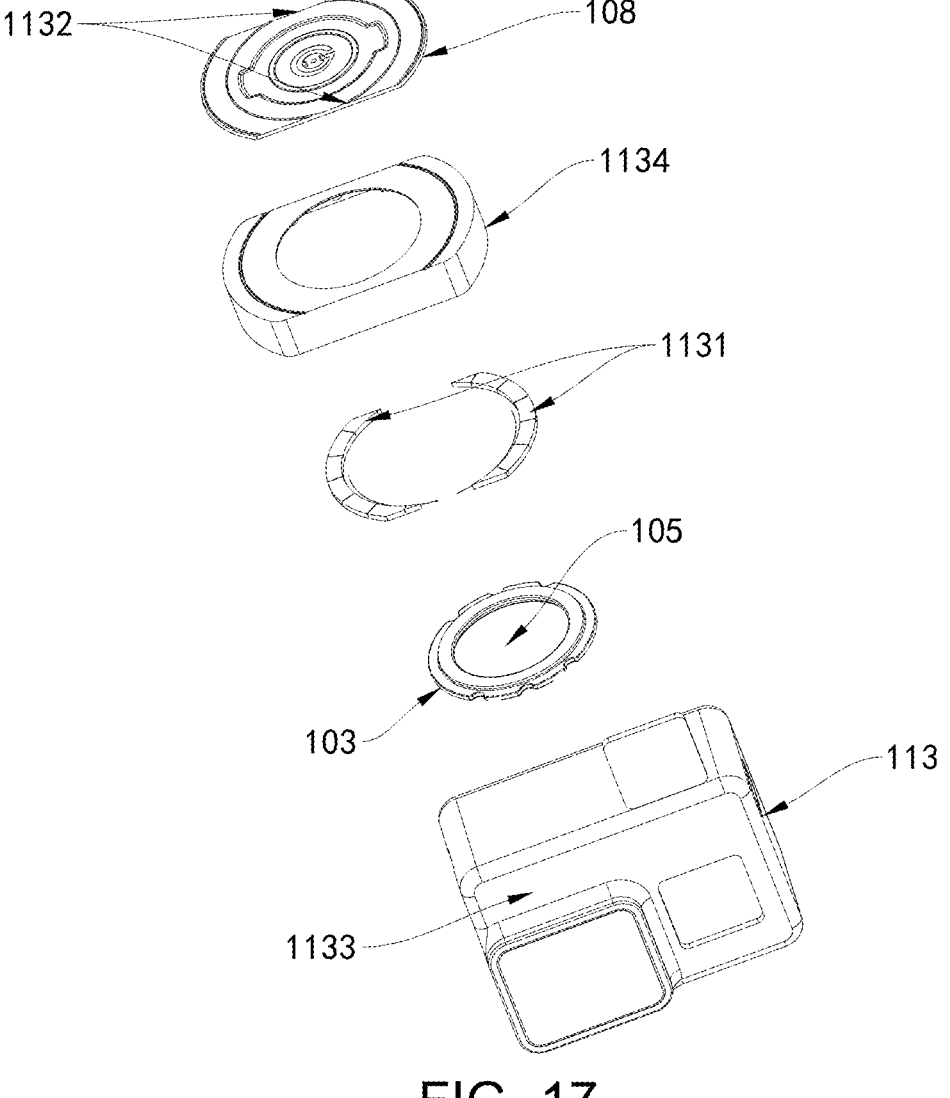
FIG. 17 is an exploded view showing a structure of an action camera according to the present disclosure.
Figure 18:
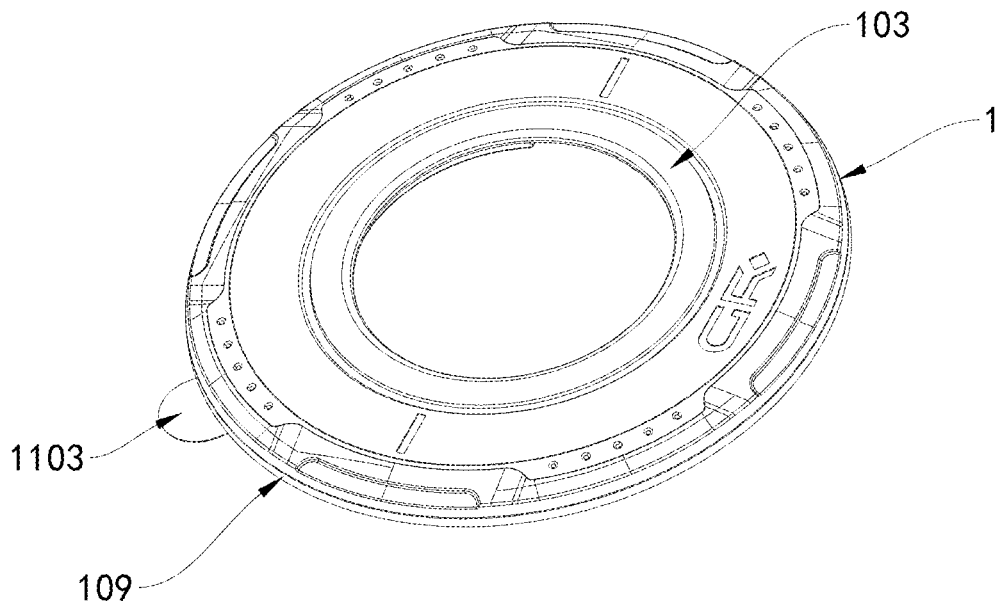
FIG. 18 is a schematic structural diagram showing a circular base according to the present disclosure.
Figure 19:
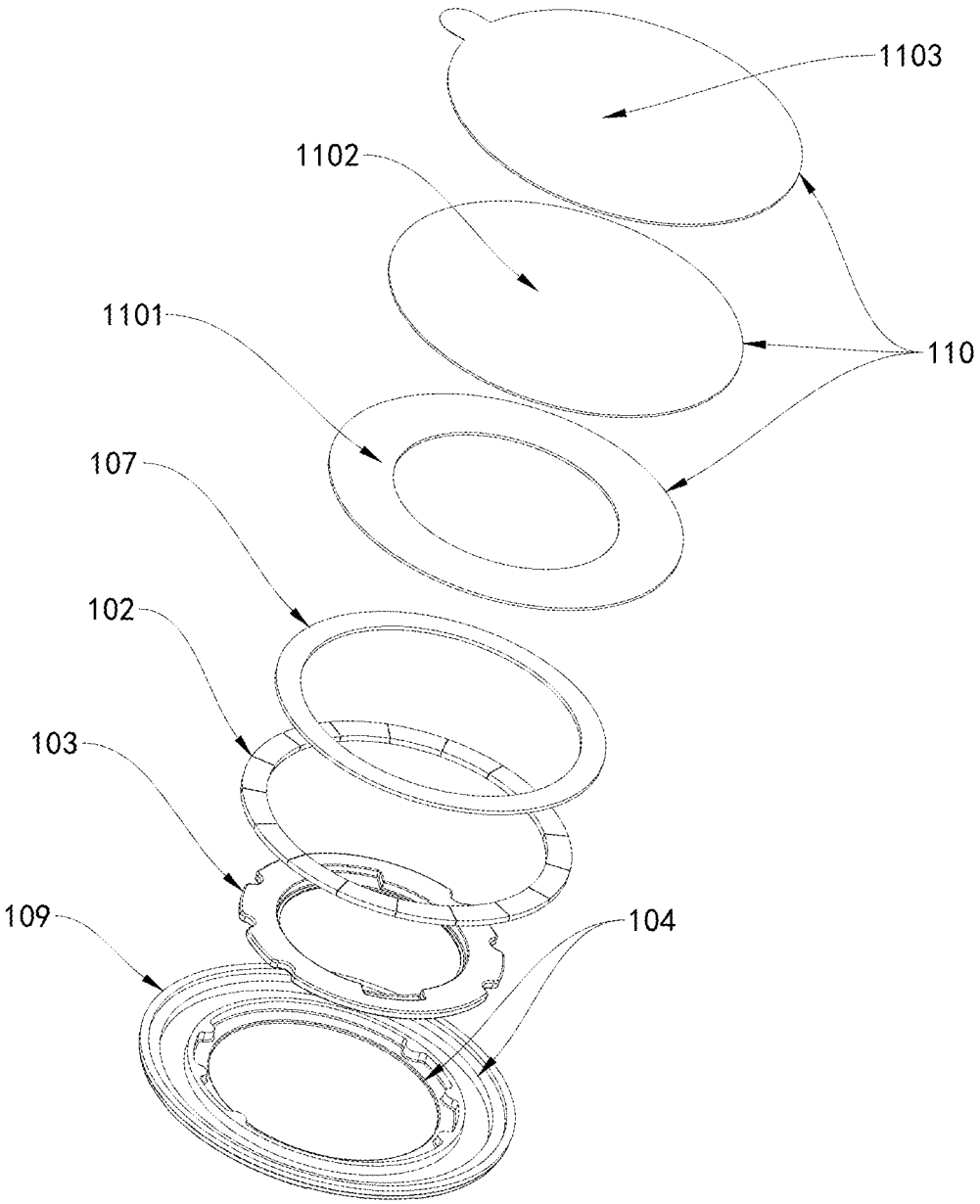
FIG. 19 is an exploded view showing an adhesive backing structure according to the present disclosure.
Figure 20:
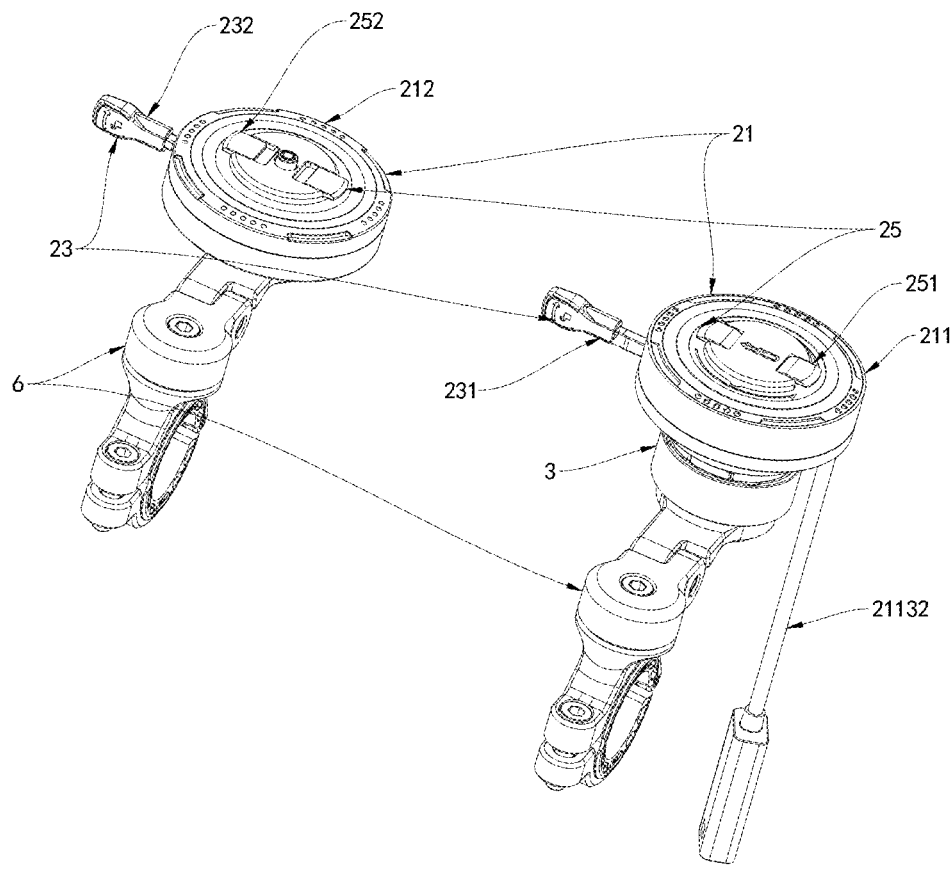
FIG. 20 is a schematic structural diagram showing a circular device according to the present disclosure.
Figure 21:
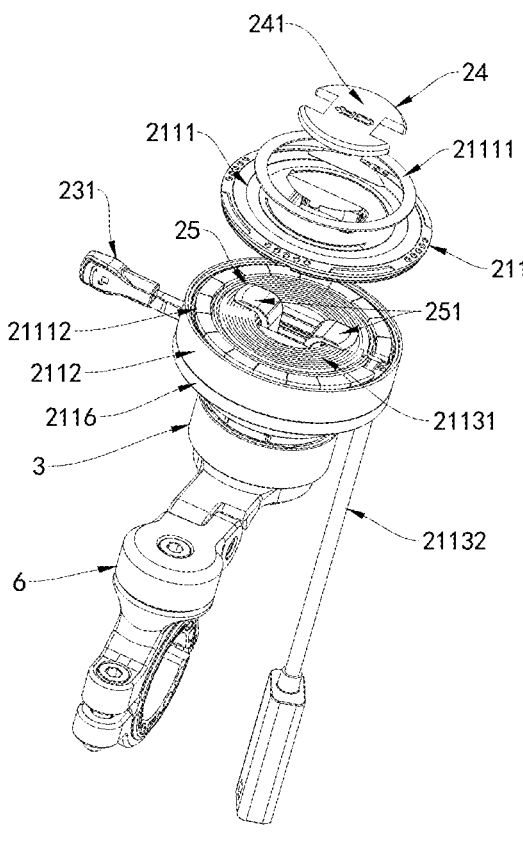
FIG. 21 is a schematic structural diagram showing a f9rst circular device according to the present disclosure.
Figure 22:
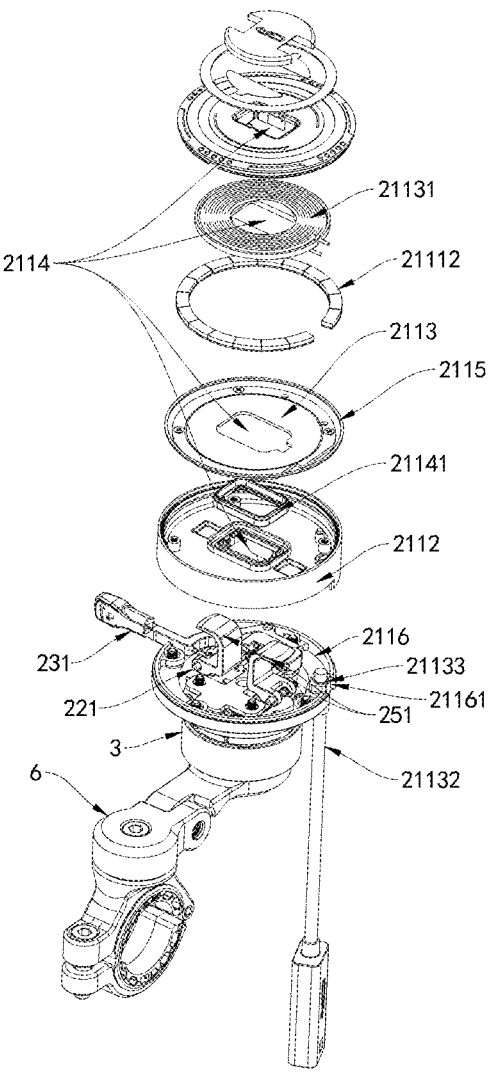
FIG. 22 is a schematic structural diagram showing a through hole according to the present disclosure.
Figure 23:
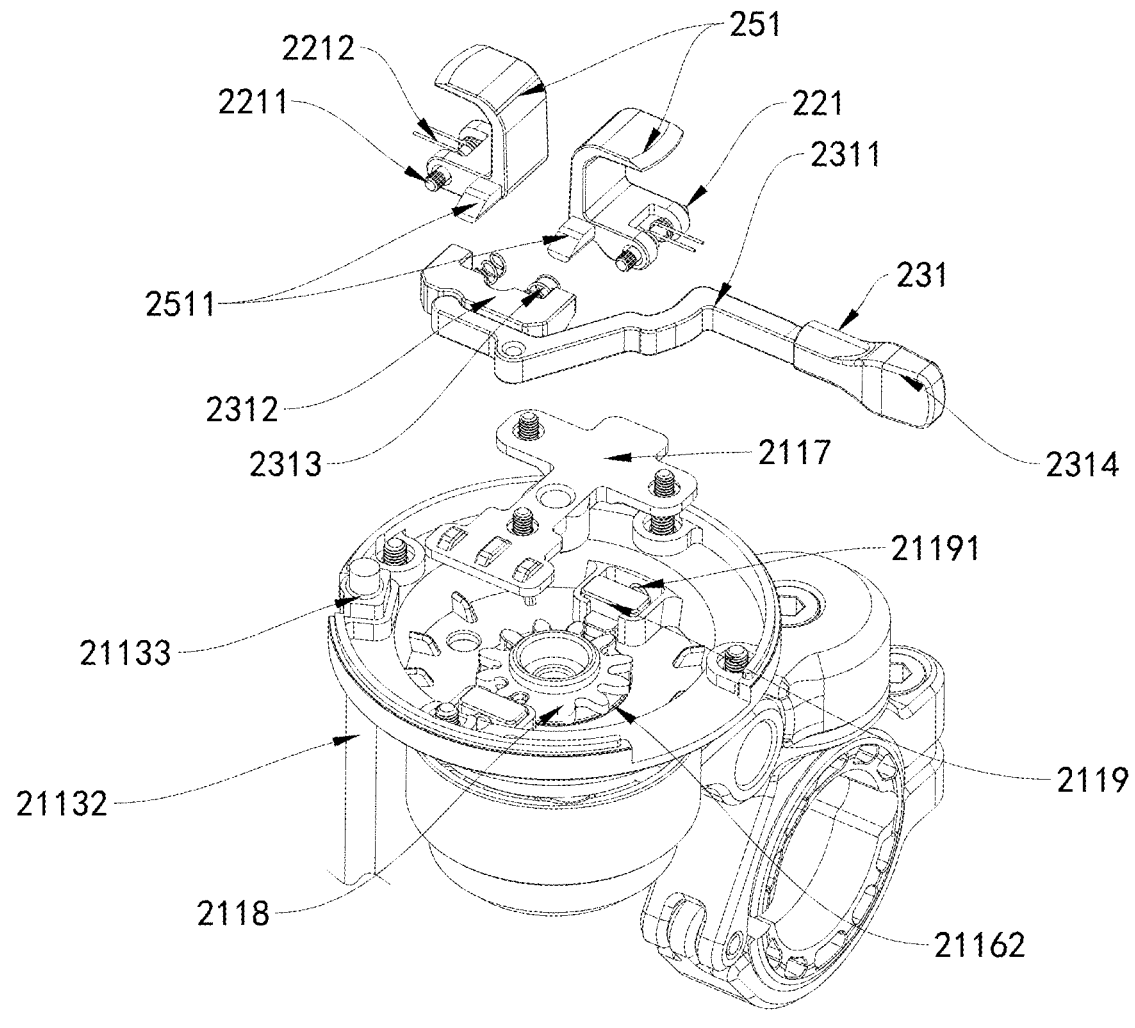
FIG. 23 is a schematic structural diagram showing a first snap-fit locking mechanism and a first lever linkage mechanism according to the present disclosure.
Figure 24:
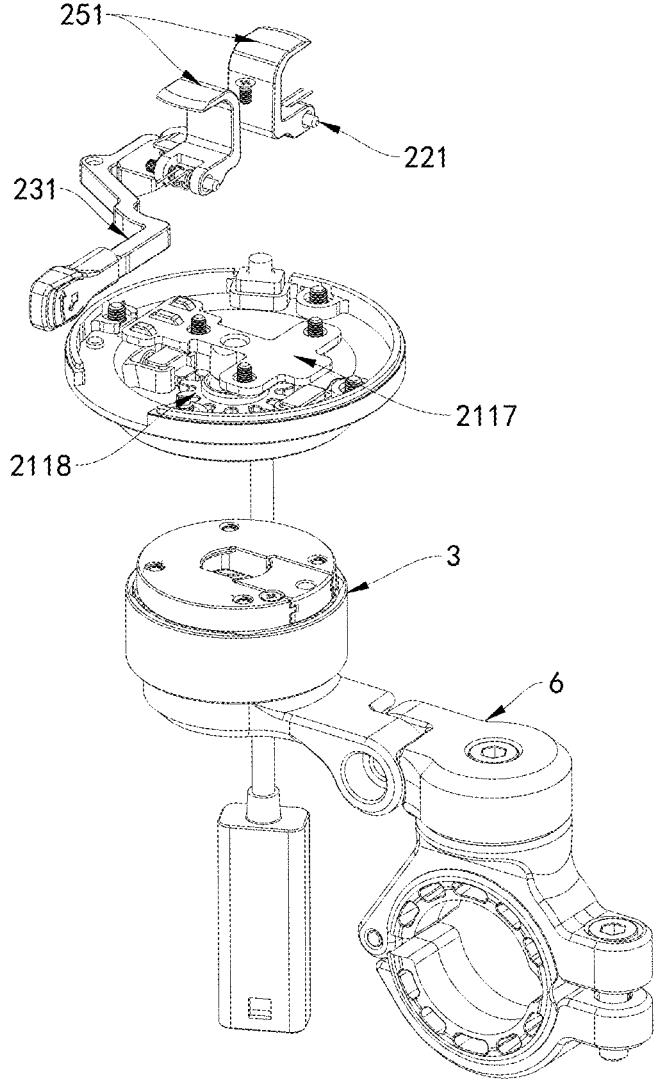
FIG. 24 is a schematic structural diagram showing a first pressure plate according to the present disclosure.
Figure 25:
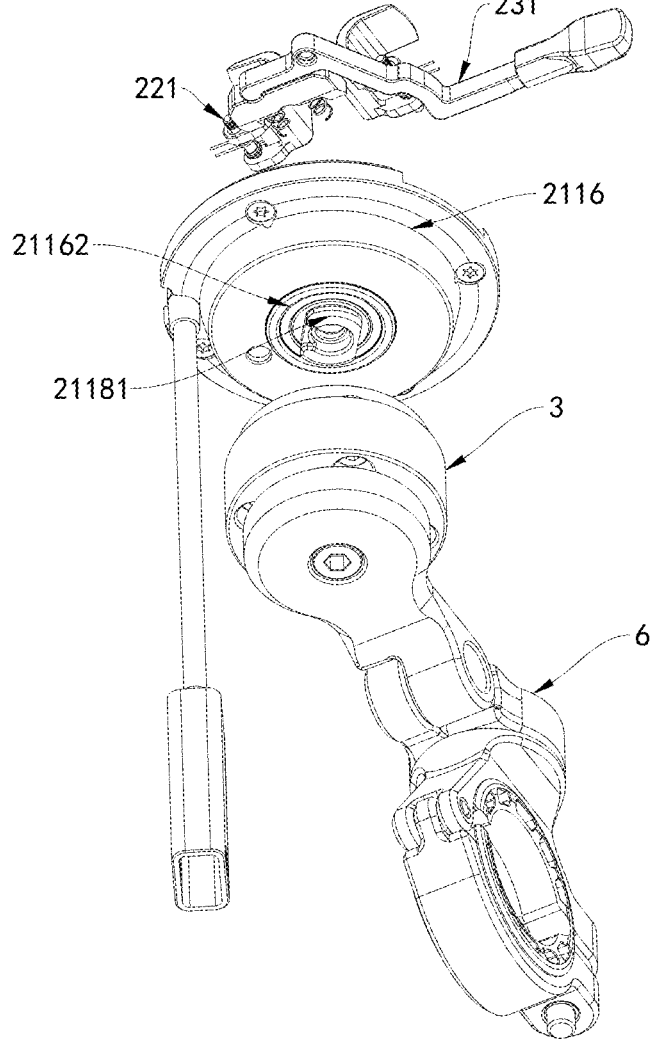
FIG. 25 is a schematic structural diagram showing an obround docking platform according to the present disclosure.
Figure 26:
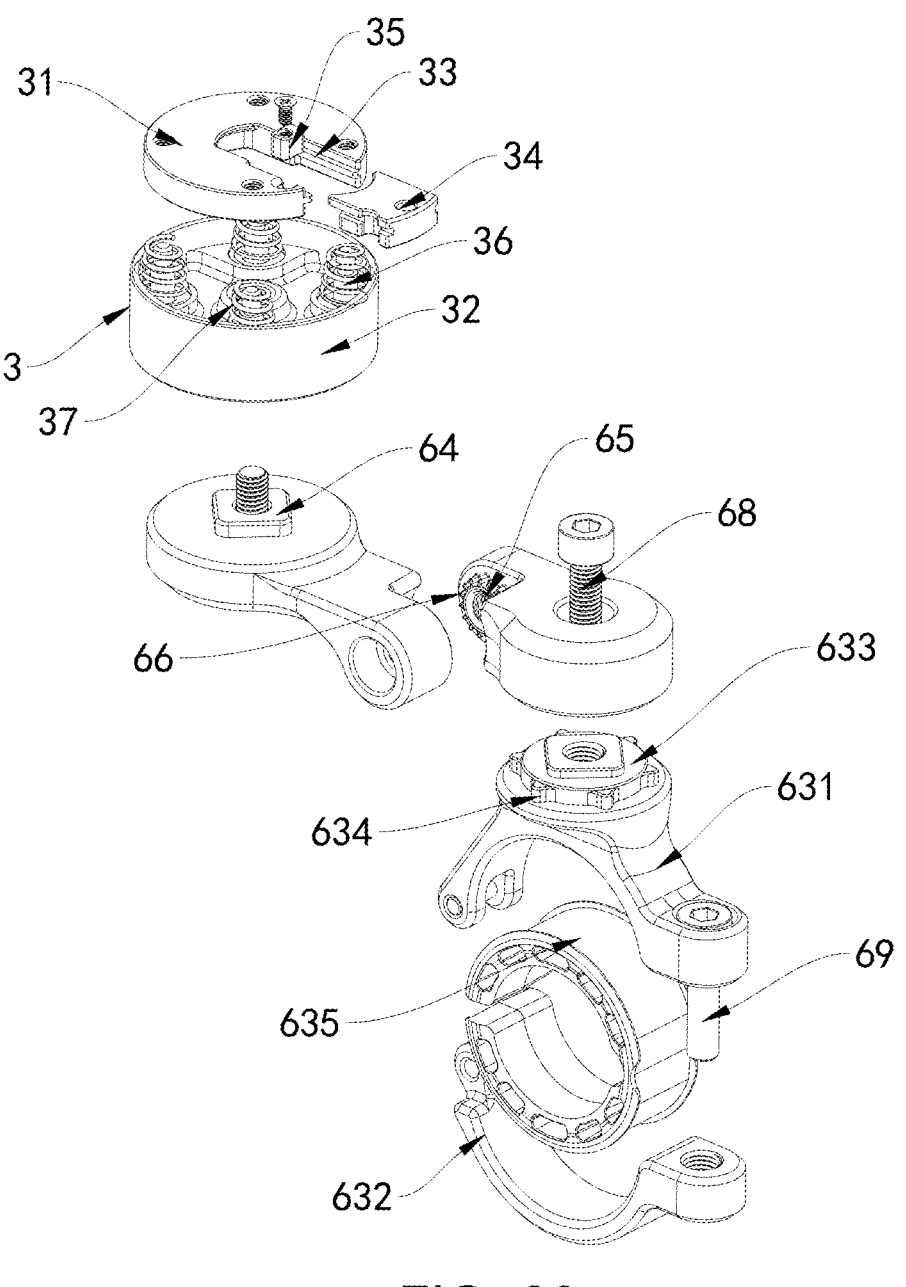
FIG. 26 is an exploded view showing a structure of a shock-absorbing mechanism and a mount mechanism according to the present disclosure.
Figure 27:
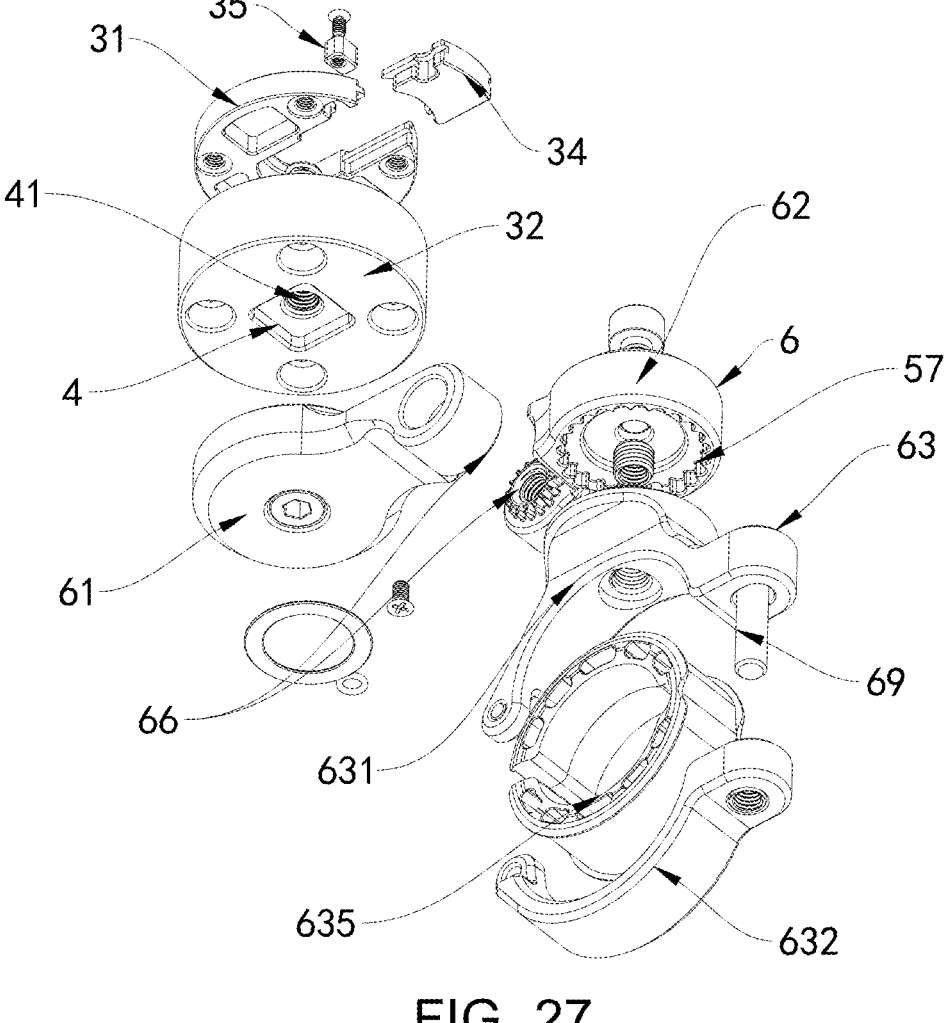
FIG. 27 is an exploded view showing a structure of a shock-absorbing mechanism and a mount mechanism according to the present disclosure.
Figure 28:
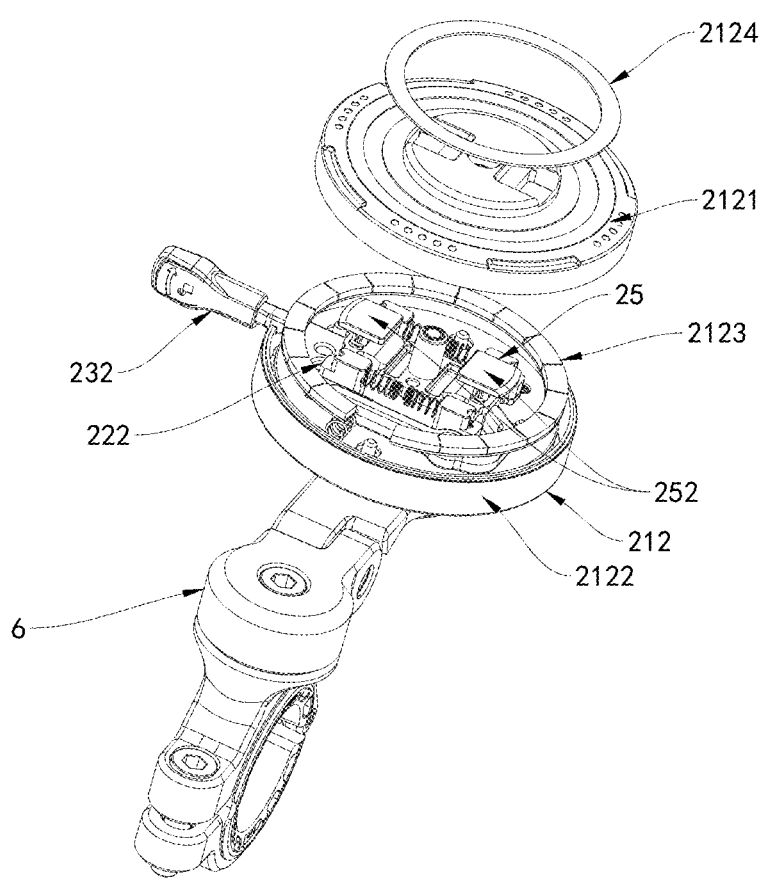
FIG. 28 is a schematic diagram showing an internal structure of a second circular device according to the present disclosure.
Figure 29:
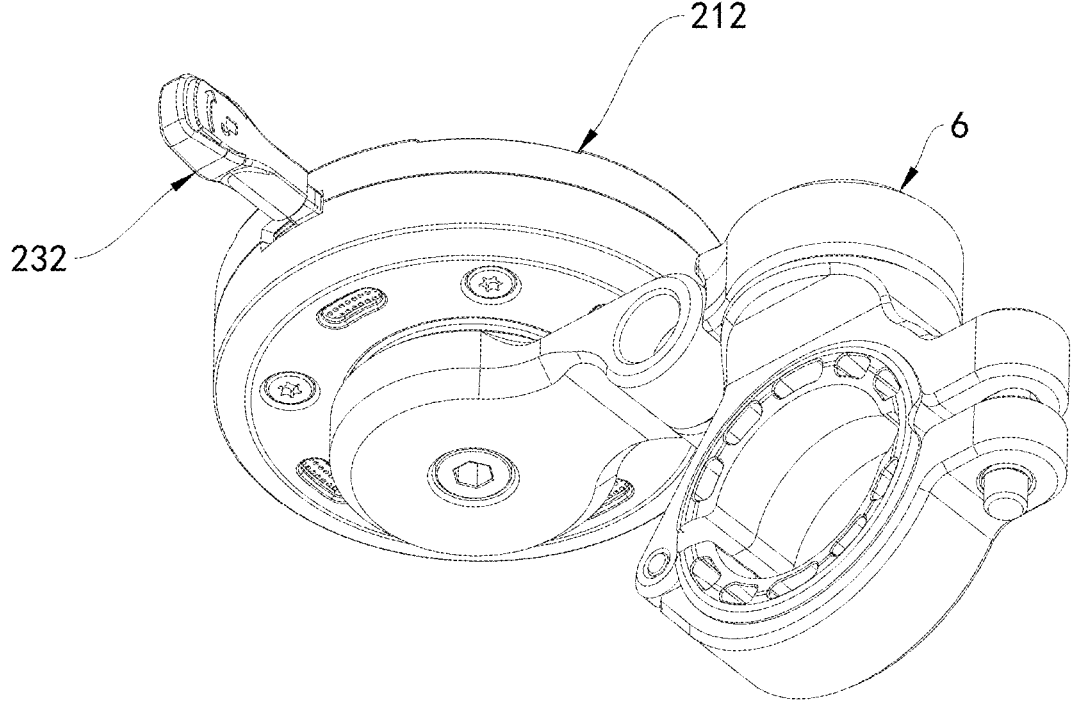
FIG. 29 is a schematic structural diagram showing a second circular device according to the present disclosure.
Figure 30:
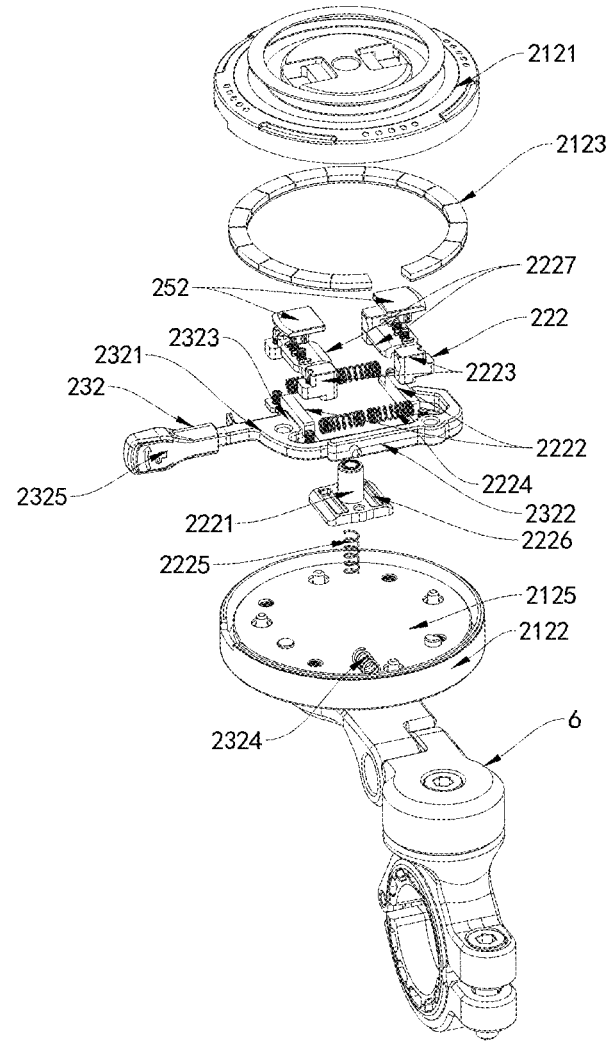
FIG. 30 is a schematic structural diagram showing a second snap-fit locking mechanism and a second lever linkage mechanism according to the present disclosure.
Figure 31:
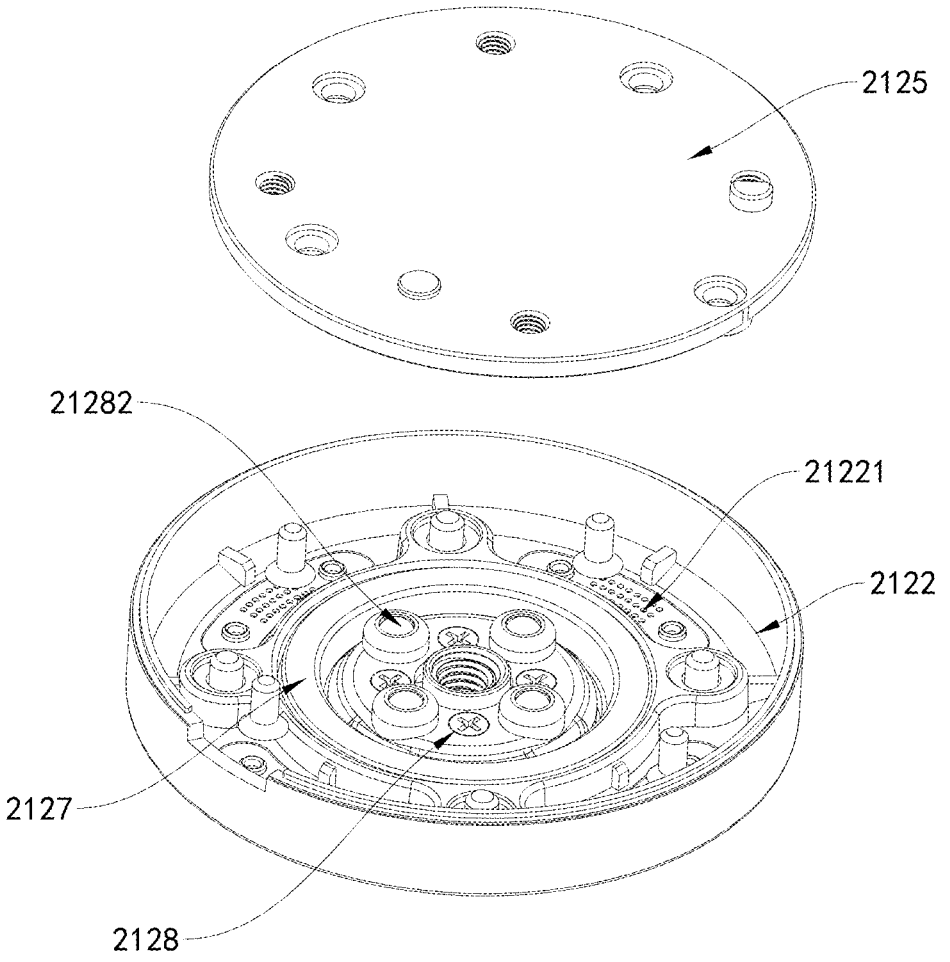
FIG. 31 is a schematic structural diagram showing a turntable according to the present disclosure.
Figure 32:
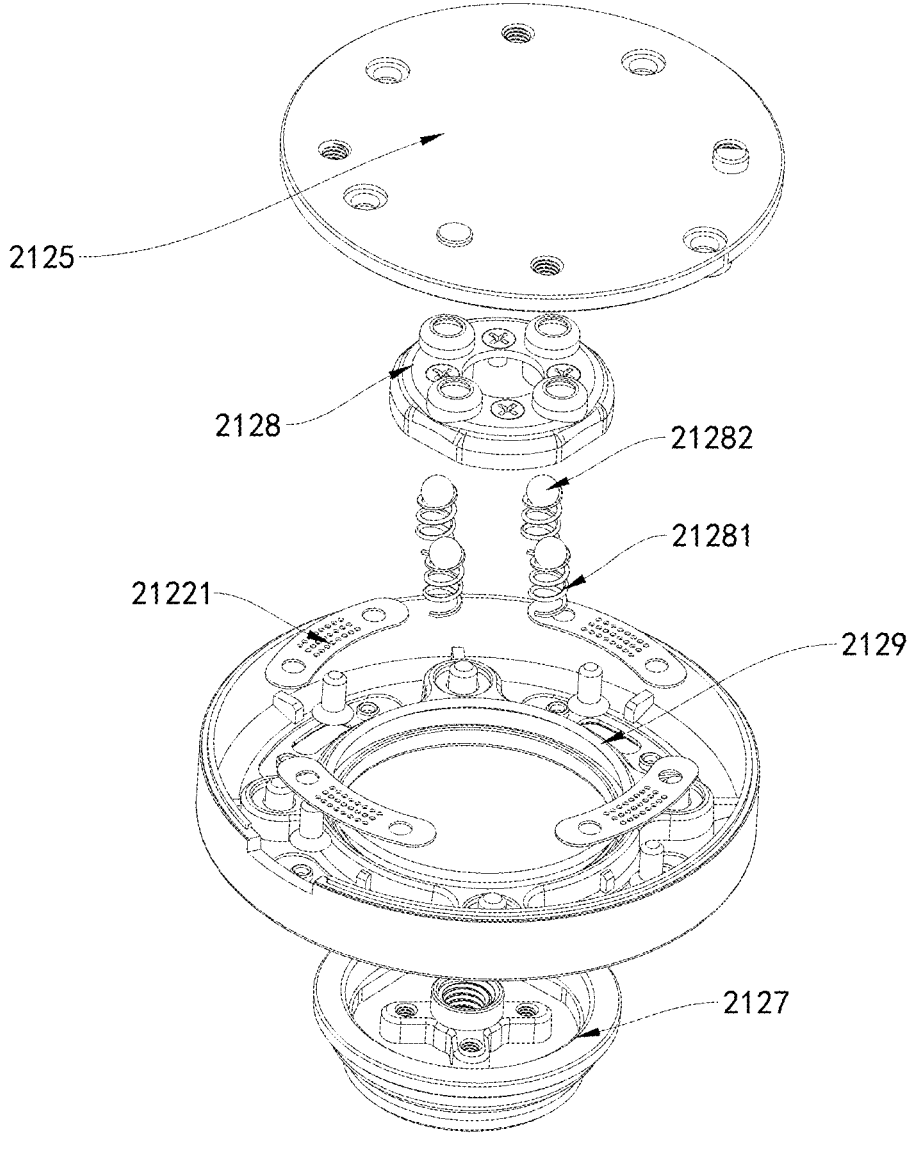
FIG. 32 is a schematic structural diagram showing a damping rubber ring according to the present disclosure.
Figure 33:
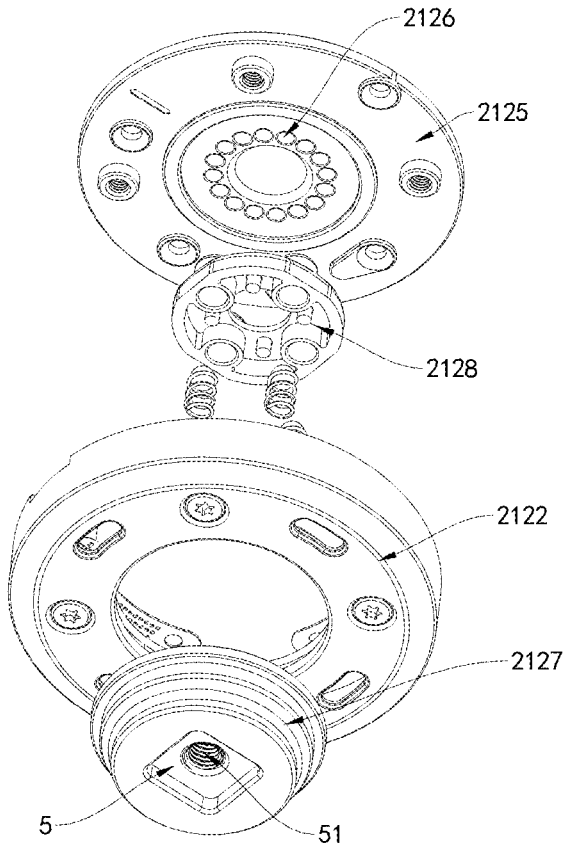
FIG. 33 is a schematic structural diagram showing an arc-shaped locating slot according to the present disclosure.
Figure 34:
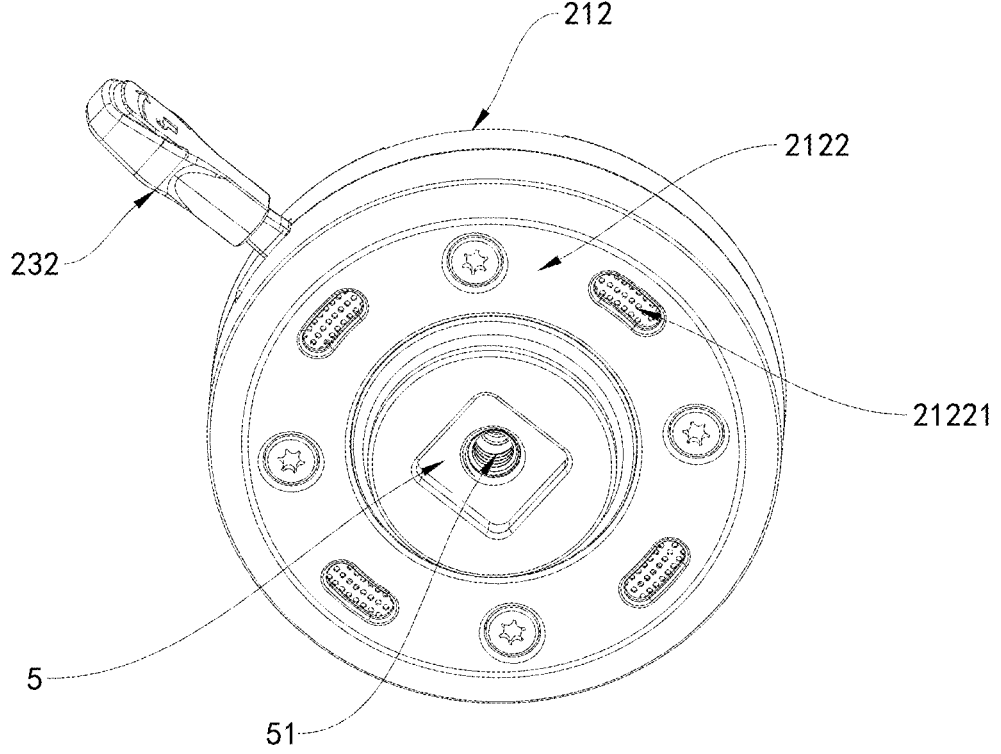
FIG. 34 is a schematic structural diagram showing a second mount docking slot according to the present disclosure.
Figure 35:
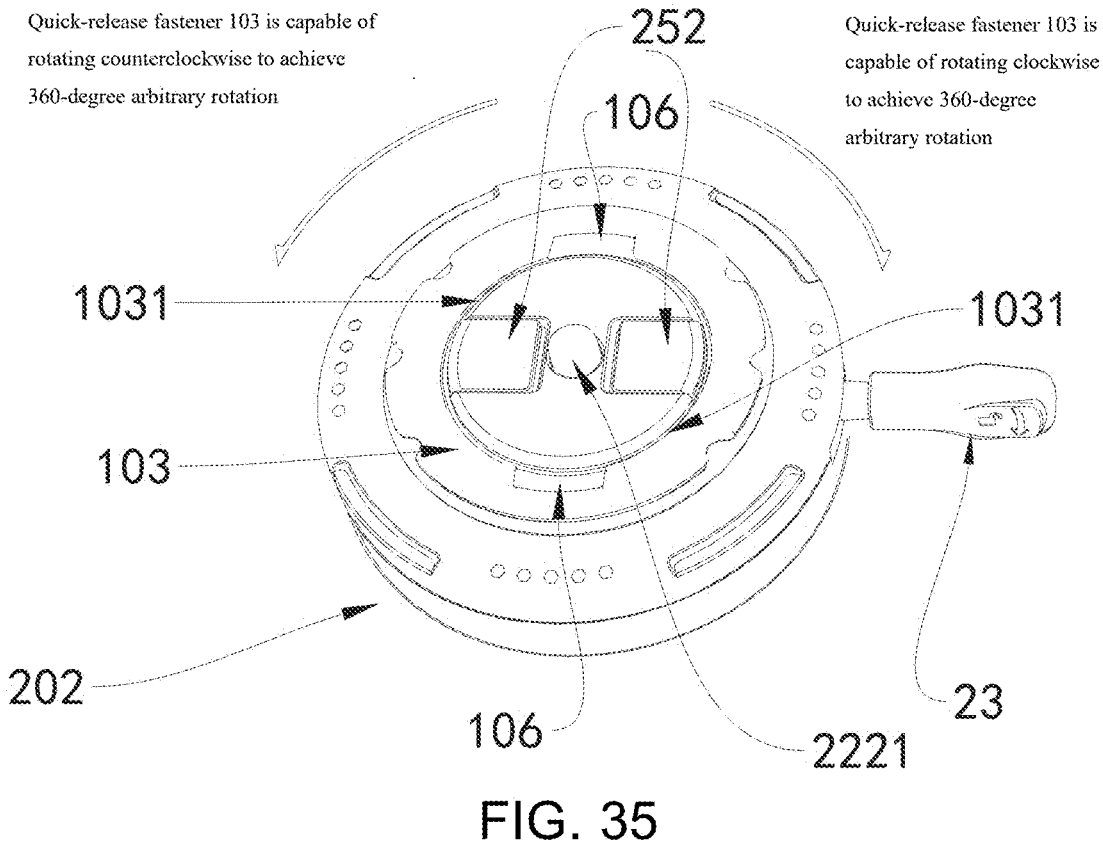
FIG. 35 is a schematic structural diagram showing a connection motion state of a magnetic trigger connection module and a quick-release fastener according to the present disclosure.
Figure 36:
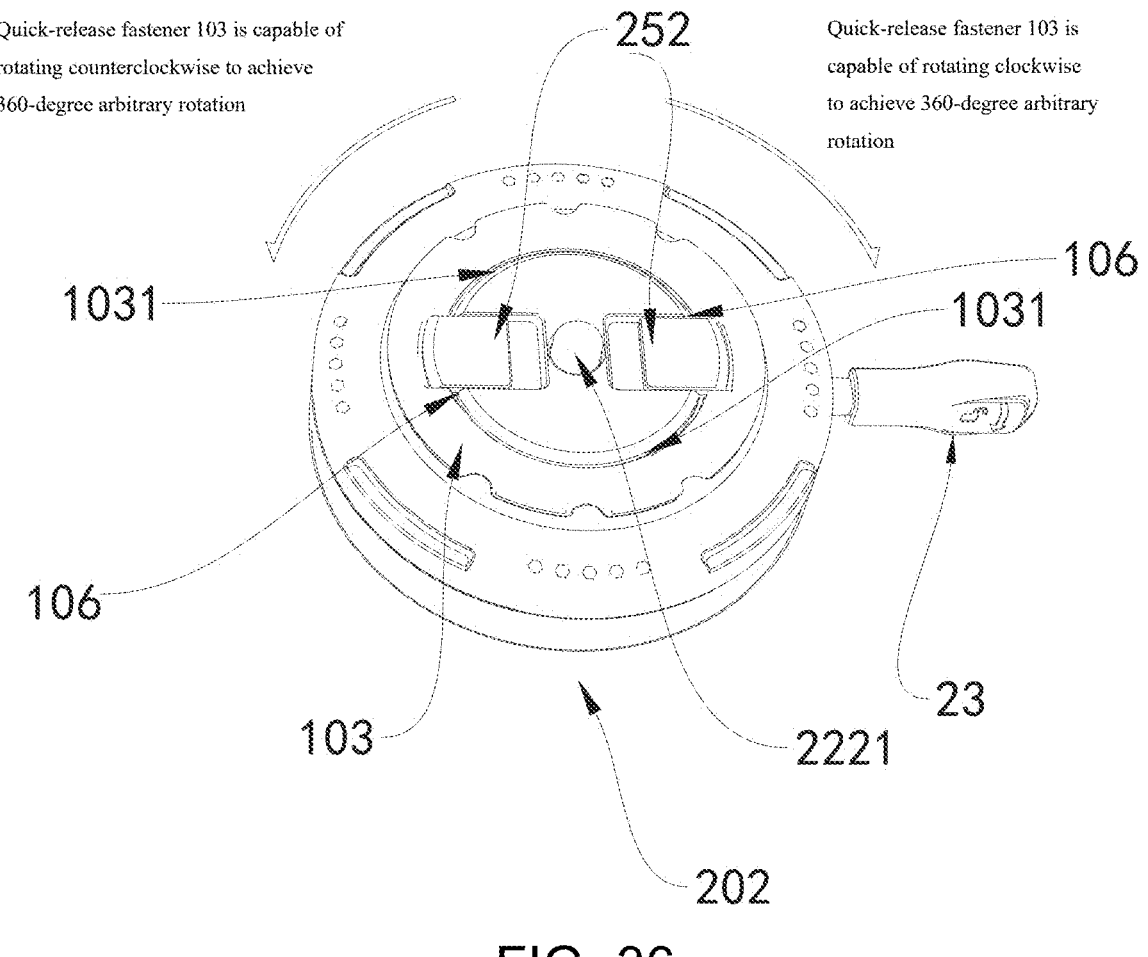
FIG. 36 is a schematic structural diagram showing a connection locking state of a magnetic trigger connection module and a quick-release fastener according to the present disclosure.
Figure 37:
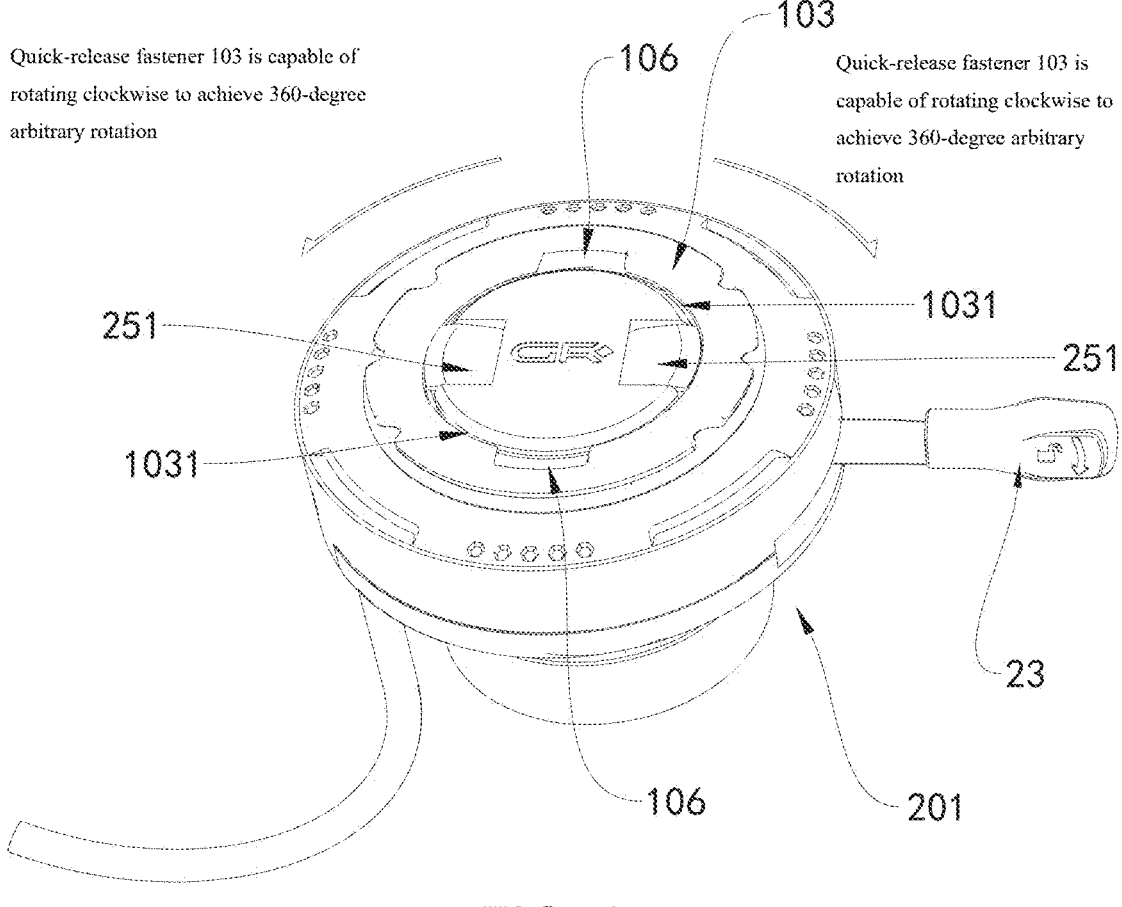
FIG. 37 is a schematic structural diagram showing a connection motion state of a magnetic press-fit connection module and a quick-release fastener according to the present disclosure.
Figure 38:
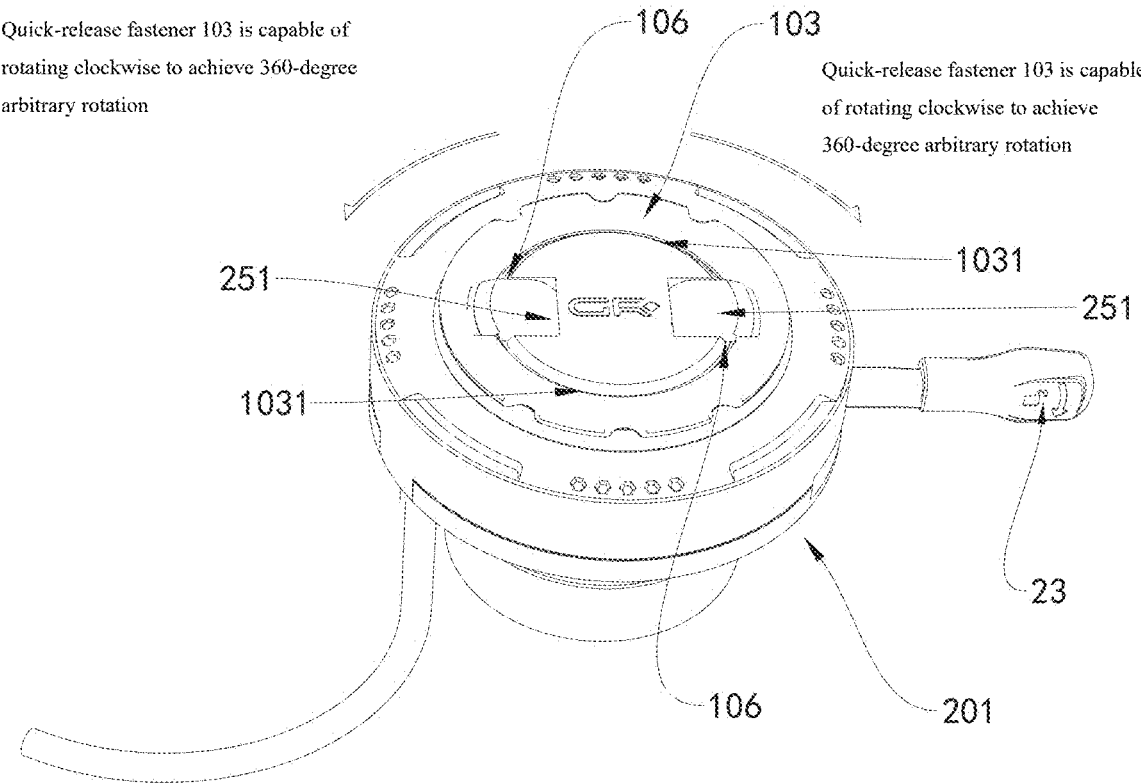
FIG. 38 is a schematic structural diagram showing a connection locking state of a magnetic press-fit connection module and a quick-release fastener according to the present disclosure.
Figure 39:
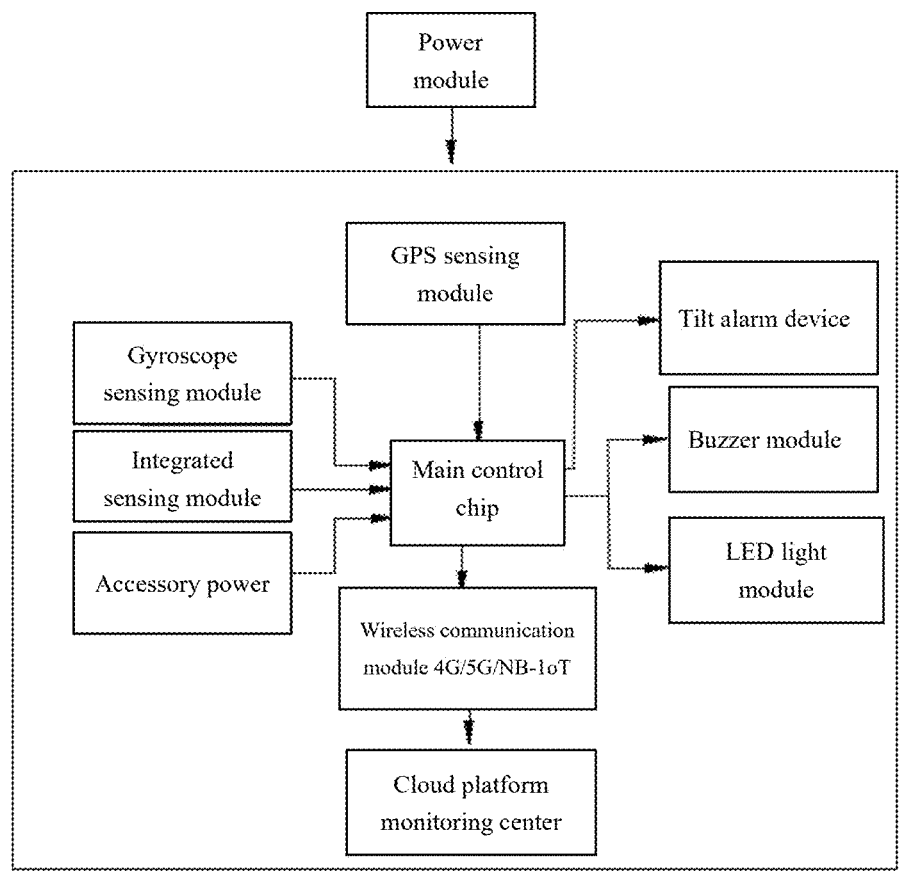
FIG. 39 is a block diagram showing an intelligent safety system according to the present disclosure.

As shown in FIGS. 1-39, one embodiment of the present disclosure provides a magnetic snap-on intelligent quick connection system, comprising:

A device connection module 1, including a circular base 101, an annular magnet array 102, and a quick-release fastener 103;

The base 101 is provided with a circular mounting slot 104, the annular magnet array 102 is fixed in the mounting slot 104, the quick-release fastener 103 is fixed in the middle of the mounting slot 104, the quick-release fastener 103 is provided with a circular central hole 105, two circumferentially distributed snap-fit locating sockets 106, and circumferentially distributed rotating slots 1031; the snap-fit locating sockets 106 being located at two horizontal ends of the rotating slots 1031;

A mount connection module 2, including a circular device 21, a snap-fit locking mechanism 22, and a lever linkage mechanism 23;

A top of the circular device 21 is provided with a frustum 24 capable of being inserted into the central hole 105, the snap-fit locking mechanism 22 includes two latches 25 movably disposed in the circular device 21 and capable of partially extending out of a side of the frustum 24, the lever linkage mechanism 23 is connected to the latches 25;

The device connection module 1 and the mount connection module 2 are magnetically attracted to insert the frustum 24 into the central hole 105 and enable the device connection module 1 to rotate 360 degrees arbitrarily relative to the mount connection module 2; when the latches 25 are aligned with the snap-fit locating sockets 106, the latches 25 are engaged to achieve mechanical locking; the lever linkage mechanism 23 is capable of being operated to drive the latches 25 to disengage from the latch locating sockets 106 to achieve disassembly. The snap-fit locating socket 106 is configured to lock the device connection module 1 and the mount connection module 2; the rotating slot 1031 is configured to guide the rotation of the mount connection module 2, enabling the system to lock in a plurality of horizontal directions; the layout facilitates lever unlocking operation of the lever linkage mechanism 23 and conforms to ergonomic principles, allowing an operator to complete unlocking and disassembly with one hand.

As shown in FIGS. 1-39, in some embodiments, the mounting slot 104 of the base 101 includes an outer ring slot 1041 and an inner ring slot 1042 which are concentric; the annular magnet array 102 is embedded in the outer ring slot 1041;

The quick-release fastener 103 is embedded in the inner ring slot 1042, and a foolproof structure 1043 is provided between the quick-release fastener 103 and the inner ring slot 1042 to limit a circumferential assembly angle of the quick-release fastener 103.

The mounting slot 104 adopts the concentric outer ring slot 1041 and inner ring slot 1042 structure, which realizes precise locating and mounting of the annular magnet array 102 and the quick-release fastener 103, ensuring uniform force during magnetic alignment. The foolproof structure 1043 effectively prevents the quick-release fastener 103 from shifting circumferentially during assembly, ensuring that the two snap-fit locating sockets 106 are always in the horizontal position required by the design, thereby improving the product assembly accuracy and use reliability.

As shown in FIGS. 1-39, in some embodiments, the device connection module 1 further includes an annular magnet fixing latch 107 and a magnet protective cover 108; the annular magnet fixing latch 107 is disposed on a side of the annular magnet array 102 away from the base 101;

The magnet protective cover 108 fixedly covers the base 101 and encapsulates the annular magnet fixing latch 107 and the quick-release fastener 103 within the mounting slot 104;

The magnet protective cover 108 is fixed to the base 101 by any means of snap-fitting, ultrasonic welding, or adhesive bonding.

By setting the annular magnet fixing latch 107 and the magnet protective cover 108, a triple protection structure is formed. The annular magnet fixing latch 107 provides axial clamping force to the annular magnet array 102 to prevent the magnets from loosening. The magnet protective cover 108, as a final encapsulation component, not only protects the internal precision mechanism from external impacts, but also implements the dustproof and waterproof function. Multiple fixing approaches (clamping, ultrasonic welding or bonding) provide flexible production processes to adapt to the assembly requirements of different material bases 101, significantly improving the structural integrity and service life of the product.

As shown in FIGS. 1-39, in some embodiments, the base 101 is an independent circular base 109, and the circular base 109 is attached to a surface of a terminal device 112 by an adhesive backing structure 110.

The adhesive backing structure 110 includes a perforated SM adhesive 1101, a PET film 1102, and a disc-type 3M adhesive 1103 laminated in sequence.

The adhesive backing structure 110 adopts a multi-layer composite design. The perforated SM adhesive 1101 provides initial bonding locating, the Mylar film 1102 plays a role in stress dispersion and electrical insulation, and the disc-type 3M adhesive 1103 ensures the final bonding strength. The laminated structure can adapt to the curved surface characteristics of different terminal devices 112 and maintain stable bonding performance in high temperature and high humidity environments, achieving the rapid and reliable mounting of a receiver module on various terminal devices 112.

As shown in FIGS. 1-39, in some embodiments, the base 101 is a component of a protective shell 111; the protective shell 111 includes a bottom shell 1111 and a silicone outer shell 1112, the bottom shell 1111 of the protective shell 111 extends to a back of the silicone outer shell 1112 to form an annular boss 1113, an inner cavity of the annular boss 1113 forms the mounting slot 104 of the base 101; the protective shell 111 is a mobile phone protective shell 1114 or a tablet computer protective shell 1115.

By integrating the base 101 onto the bottom shell 1111 of the protective shell 111 and forming the annular boss 1113 on the bottom shell 1111, seamless integration of the device connection module 1 and the protective shell 111 is achieved. The structural design maintains the integrity of the protective shell 111 and provides a standardized connection interface. The inner cavity of the annular boss 1113 precisely accommodates the annular magnet array 102 and the quick-release fastener 103, ensuring that the device connection module 1 is flush with the surface of the protective shell 111, thus improving the product aesthetics and user comfort.

The protective shell 111 is specifically designed as the mobile phone protective shell 1114 or the tablet protective shell 1115, and specially optimized for mobile terminals of different sizes. Through standardized interface design, the mount connection module 2 of the same series can be adapted to multiple mobile terminals, thereby greatly improving the versatility of the product and the user experience.

As shown in FIGS. 1-39, in some embodiments, a buffer layer 1116 is provided on a side of the bottom shell 1111 facing the terminal device 112, and the buffer layer 1116 is felt 1117 or an embedded sponge block 1118.

By setting the felt 1117 or the embedded sponge block 1118 as the buffer layer 1116, the problem of scratches that the hard bottom shell 1111 may cause to the surface of the terminal device 112 is effectively solved. The felt 1117 provides comprehensive surface protection, while the embedded sponge block 1118 disperses pressure through point support and considers heat dissipation requirements, providing all-round protection for the terminal device 112.

As shown in FIGS. 1-39, in some embodiments, the base 101 is a mounting structure directly formed on the terminal device body 112; the terminal device 112 is a motorcycle console 1121 or a UAV remote controller 1122.

The base 101 is directly integrated onto the body of professional equipment such as the motorcycle console 1121 or the UAV remote controller 1122, achieving native support for the connection system. The integrated design avoids the cumbersome feeling brought by external accessories, maintains the integrity and aesthetics of the professional equipment, and ensures connection reliability, meeting the use requirements of the professional equipment in high-speed motion environments.

As shown in FIGS. 1-39, in some embodiments, the base 101 is adapted to a non-circular terminal device 113 and has an obround shape; the annular magnet array 102 is composed of two sets of C-shaped magnets 1131 arranged opposite each other; an outer edge of the magnet protective cover 108 is correspondingly provided with symmetrical notches 1132 to make its shape consistent with the base 101; the non-circular terminal device 113 is an action camera 1133 provided with an obround base 1134 for mounting the base 101.

To address the special shape requirements of the action camera 1133, an innovative solution is adopted: the obround base 1134 and an array of the C-shaped magnets 1131 arranged in opposite directions. The structure maximizes the magnetic attraction area within a limited space and ensures connection strength. The design of the symmetrical notches 1132 of the magnet protective cover 108 matches the shape of the base 101, maintaining both aesthetics and protection, thereby achieving perfect fit for non-standard shaped devices.

As shown in FIGS. 1-39, in some embodiments, the quick-release fastener 103 is made of a ceramic or metal material or engineering plastic, and magnets of the annular magnet array 102 are arranged with alternating polarities to enhance magnetic attraction force.

By adopting the quick-release fasteners 103 made of ceramic, metal, or engineering plastics, the wear resistance and service life of the latch 25 mechanism are significantly improved. The annular magnet array 102 optimizes the magnetic field distribution, providing stronger magnetic attraction within the same volume, while achieving directional focusing of magnetic lines of force, ensuring self-centering effect and connection stability during connection.

As shown in FIGS. 1-39, in some embodiments, an intelligent safety system is integrated in the mount connection module 2, and the intelligent safety system includes:

A main control chip;

A gyroscope sensing module electrically connected to the main control chip and configured to detect a tilt angle of a device and generate tilt data;

A tilt alarm device electrically connected to the main control chip and configured to receive an alarm signal from the main control chip and issue a warning;

A GPS sensing module electrically connected to the main control chip and configured to receive a satellite signal to calculate precise position and speed data of the device;

A wireless communication module electrically connected to the main control chip and configured to send the position data, the speed data and device status information to a remote monitoring platform or a preset mobile terminal via a wireless network;

A power management module electrically connected to the main control chip and configured to receive external ACC power and supply power to each module;

The main control chip is configured to receive and process the tilt data from the gyroscope sensing module, drive the tilt alarm device to issue an alarm when the tilt angle exceeds a preset threshold; and receive position data from the GPS sensing module and send out an alarm signal containing position information through the wireless communication module.

By integrating the gyroscope sensing module, the GPS sensing module, the wireless communication module, and the tilt alarm device with the main control chip through coordination, an active safety protection system integrating attitude perception, precise locating, and remote communication is constructed. When the gyroscope sensing module detects the risk of the device tipping over, the system can instantly trigger a local audible and visual alarm. Meanwhile, it uses the GPS sensing module to obtain precise position data and automatically sends the alarm containing the position information to the designated terminal through the wireless communication module, which achieves a fully automatic and rapid response from danger perception and real-time warning to position tracking, greatly improving the safety protection level and emergency response capability of the riding equipment.

As shown in FIGS. 1-39, in some embodiments, the mount connection module 2 is a magnetic press-fit connection module 201 which is automatically aligned with the device connection module 1 through magnetic attraction; by pressing and extending the snap-fit locking mechanism 22, the latches 25 enter the rotating slots 1031 and achieve 360-degree arbitrary rotation; during the rotation, regardless of rotating clockwise or counterclockwise to any angle, the snap-fit locking mechanism 22 is capable of entering the corresponding snap-fit locating socket 106 to form double-locking combining magnetic attraction and snap-fitting;

The circular device 21 is a first circular device 211, and a first frustum 241 is provided on a top of the first circular device 211;

The snap-fit locking mechanism 22 is a first snap-fit locking mechanism 221;

The lever linkage mechanism 23 is a first lever linkage mechanism 231.

A complete magnetic press-fit connection module 201 is constructed through the integrated design of the first circular device 211, the first frustum 241, the first snap-fit locking mechanism 221, and the first lever linkage mechanism 231. The magnetic press-fit connection module 201 is automatically aligned with the device connection module 1 through magnetic attraction; by pressing and extending the snap-fit locking mechanism 22, the latches 25 enter the rotating slots 1031 and achieve 360-degree arbitrary rotation; during the rotation, regardless of rotating clockwise or counterclockwise to any angle, the snap-fit locking mechanism 22 is capable of entering the corresponding snap-fit locating socket 106 to form double-locking combining magnetic attraction and snap-fitting.

As shown in FIGS. 1-39, in some embodiments, the first circular device 211 includes a first upper shell 2111, a first middle shell 2112, and a first bottom shell 2116 arranged from top to bottom in sequence; the first frustum 241 is bonded to a top of the first upper shell 2111 through an adhesive, a wireless charging control board 2113 is provided in the first middle shell 2112, a wireless charging coil 21131 is integrated on a top of the wireless charging control board 2113, a through hole 2114 is provided in the first middle shell 2112, the wireless charging control board 2113, the wireless charging coil 21131, and the first upper shell 2111, respectively, a waterproof sleeve 21141 is provided in the through hole 2114 of the first middle shell 2112 and the through hole 2114 of the wireless charging control board 2113, a waterproof ring 2115 is provided between the first upper shell 2111 and the first middle shell 2112, and a first decorative ring 21111 is embedded on the top of the first upper shell 2111.

The layered structure of the first upper shell 2111, the first middle shell 2112, and the first bottom shell 2116 facilitates the modular assembly of internal components. The double protection of the waterproof sleeve 21141 and the waterproof ring 2115 ensures that sensitive components such as the wireless charging coil 21131 are protected from the humid environment. The first decorative ring 21111 enhances the product appearance and texture while avoiding direct wear on the back of the terminal device 112. The first frustum 241 boned through the adhesive facilitates maintenance and replacement. The wireless charging coil 21131 can wirelessly charge the terminal device 112 after connecting to the terminal device 112 having a wireless charging function without the need for a separate charging cable. Available immediately and ready for charging, making it more convenient to use.

As shown in FIGS. 1-39, in some embodiments, a first annular magnet group 21112 magnetically engaged with the annular magnet array 102 is embedded in the first upper shell 2111, the first snap-fit locking mechanism 221 includes two first latches 251 symmetrically hinged to a bottom of the first middle shell 2112 through a fixing shaft 2211, a torsion spring 2212 sleeves the fixing shaft 2211, one end of the first latch 251 away from the fixing shaft 2211 penetrates through a plurality of through holes 2114 and extends to a side portion of the first frustum 241, and a ramp 2511 located on one side of the fixing shaft 2211 is provided on one side of the first latch 251;

A notch 21161 is provided on one side of the first bottom shell 2116, and a power cord 21132 with one end penetrating through the first middle shell 2112 and emerging from the notch 21161 is integrated at a bottom of the wireless charging control board 2113, a sealing ring 21133 is provided between the power cord 21132 and the first middle shell 2112;

The first lever linkage mechanism 231 includes a first lever body 2311 and a U-shaped slider 2312, the U-shaped slider 2312 is slidably disposed at the bottom of the first middle shell 2112 by a slider spring 2313, bottoms of two ends of the U-shaped slider 2312 are inclined surfaces and are respectively opposite to two ramps 2511, the first lever body 2311 is rotatably disposed at the bottom of the first middle shell 2112, one end of the first lever body 2311 flexibly contacts one side of the U-shaped slider 2312, and the other end of the first lever body 2311 extends to the outside of the first middle shell 2112 and is provided with a first lever silicone sleeve 2314.

The device connection module 1 is attracted to the first annular magnet group 21112 via the annular magnet array 102, achieving automatic alignment of the first frustum 241 with the central hole 105. During alignment, the outer edge of the central hole 105 abuts against the first latch 251, and the second latch 252 compresses the torsion spring 2212 to automatically flip and avoid it. When the first frustum 241 is fully inserted into the central hole 105, the device connection module 1 is rotated to align the first latch 251 with the snap-fit locating socket 106. Under the rebound force of the first torsion spring 2212, the first latch 251 automatically engages with the snap-fit locating socket 106, to achieve locking. When unlocking is required, by moving the exposed part of the first lever body 2311, one end of the first lever body 2311 abuts against the U-shaped slider 2312, the U-shaped slider 2312 compresses the slider spring 2313, and at the same time, the inclined surfaces at the bottoms of the two ends of the U-shaped slider 2312 abut against the ramps 2511 of the two first latches 251, applying a force to flip the two first latches 251 in opposite directions, so that the first latches 251 disengage from the inside of the snap-fit locating socket 106, and the device connection module 1 can be removed. After releasing the first lever body 2311, the U-shaped slider 2312 resets, the first latches 251 reset to be ready for the next docking operation. The magnetic press-fit connection module 201 is automatically aligned with the device connection module 1 through magnetic attraction; by pressing and extending the snap-fit locking mechanism 22, the latch 25 enters the rotating slot 1031 and can rotate 360 degrees arbitrarily; during the rotation, regardless of rotating clockwise or counterclockwise to any angle, the snap-fit locking mechanism 22 is capable of entering the corresponding snap-fit locating socket 106 to form double-locking combining magnetic attraction and snap-fitting; the magnetic attraction is used for entering the rotating slot 1031.

As shown in FIGS. 1-39, in some embodiments, a first pressure plate 2117 located below the U-shaped slider 2312 and the first lever body 2311 is provided at the bottom of the first middle shell 2112, a gear 2118 is rotatably provided at a middle position inside the first bottom shell 2116, two transmission gear blocks 2119 are symmetrically arranged inside the first bottom shell 2116, one side of the transmission gear block 2119 meshes with the gear 2118, and the other side of the transmission gear block 2119 is provided with a gear block spring 21191, a damping sealing gasket 21162 is embedded in the inside and the bottom of the first bottom shell 2116, respectively, the damping sealing gasket 21162 located inside the first bottom shell 2116 contacts a bottom of the gear 2118, and a bottom end of the gear 2118 extends to the bottom of the first bottom shell 2116 and is provided with an obround docking platform 21181.

After the device connection module 1 is connected to the mount connection module 2, rotating the device connection module 1 causes the first upper shell 2111, the first middle shell 2112, and the first bottom shell 2116 to rotate synchronously. The first bottom shell 2116 drives the transmission gear block 2119 to abut against the gear 2118. The transmission gear block 2119 automatically compresses the gear block spring 21191 to avoid it. When it is aligned with the teeth of the gear 2118 again, it re-engages with the gear 2118 under the rebound force of the gear block spring 21191, thereby locking the angle of the device connection module 1 and achieving 360-degree stepless locating. The damping sealing gasket 21162 applies friction to the gear 2118 while sealing and waterproofing the connection between the gear 2118 and the first bottom shell 2116.

As shown in FIGS. 1-39, in some embodiments, a shock-absorbing mechanism 3 is provided at a bottom of the first circular device 211. The shock-absorbing mechanism 3 includes a shock-absorbing upper shell 31 and a shock-absorbing lower shell 32. A slide slot 33 cooperating with the obround docking platform 21181 is provided in the shock-absorbing upper shell 31. A shock-absorbing slide tenon 34 is movably provided at one end of the slide slot 33. A locating block 35 is provided between the slide slot 33 and the shock-absorbing slide tenon 34. A plurality of shock-absorbing limiting screws 36 with one end screwed into the inside of the shock-absorbing upper shell 31 are provided inside the shock-absorbing lower shell 32. A pagoda-shaped shock-absorbing spring 37 sleeves the shock-absorbing limiting screw 36, a first mount docking slot 4 is provided at a bottom of the shock-absorbing lower shell 32, and a first copper nut 41 is embedded inside the first mount docking slot 4.

The shock-absorbing mechanism 3 is detachably connected to the mount connection module 2 through the obround docking platform 21181. The locating block 35 is fixed by screws. The shock-absorbing slide tenon 34 is removed by loosening the screws and removing the locating block 35. The shock-absorbing upper shell 31 is slidably separated from the obround docking platform 21181, and the vibration received by the shock-absorbing mechanism 3 is buffered by the relative movement between the shock-absorbing upper shell 31 and the shock-absorbing lower shell 32, which compresses the pagoda-shaped shock-absorbing spring 37 to reduce the vibration transmitted to the mount connection module 2.

As shown in FIGS. 1-39, in some embodiments, the mount connection module 2 is a magnetic trigger connection module 202 which is automatically aligned with the device connection module 1 through magnetic attraction and capable of entering the rotating slot 1031; after entering the rotating slot 1031, the snap-fit locking mechanism 22 is triggered, enabling the mount connection module 2 to rotate 360 degrees arbitrarily relative to the device connection module 1; during the rotation, regardless of rotating clockwise or counterclockwise to any angle, the snap-fit locking mechanism 22 is capable of entering the corresponding snap-fit locating socket 106 to form double-locking combining magnetic attraction and snap-fitting;

The circular device 21 is a second circular device 212, and a second frustum 242 is provided on a top of the second circular device 212;

The snap-fit locking mechanism 22 is a second snap-fit locking mechanism 222;

The lever linkage mechanism 23 is a second lever linkage mechanism 232.

A complete magnetic trigger connection module 202 is constructed through the integrated design of the second circular device 212, the second snap-fit locking mechanism 222, and the second lever linkage mechanism 232. The structural strength is improved by the integral molding design of the second frustum 242 and the second upper shell 2121. The magnetic trigger connection module 202 is automatically aligned with the device connection module 1 through magnetic attraction and capable of entering the rotating slot 1031. After entering the rotating slot 1031, the guide spring 2224 is triggered, so that the mount connection module 2 can rotate 360 degrees arbitrarily relative to the device connection module 1. During the rotation, regardless of rotating clockwise or counterclockwise to any angle, the snap-fit locking mechanism 22 can enter the corresponding snap-fit locating socket 106 to form double-locking combining magnetic attraction and snap-fitting.

As shown in FIGS. 1-39, in some embodiments, the second circular device 212 includes a second upper shell 2121 and a second bottom shell 2122. The second frustum 242 and a top of the second upper shell 2121 are integrally formed, a second annular magnet group 2123 magnetically engaged with the annular magnet array 102 is embedded inside the second upper shell 2121, and a second decorative ring 2124 is embedded in the top of the second upper shell 2124;

The second snap-fit locking mechanism 222 includes a button 2221 and two guide pressure rods 2222 symmetrically arranged on two sides of the button 2221, a slider guide 2223 is provided on a top of the guide pressure rod 2222, at least one guide spring 2224 is provided between the two slider guides 2223, a second latch 252 is provided on a top of the slider guide 2223, one end of the second latch 252 away from the slider guide 2223 extends to a side portion of the second frustum 242;

A top of the button 2221 extends to a top of the second frustum 242, a bottom of the button 2221 is provided with a button spring 2225, and a guide slot 2226 is provided on two sides of the bottom of the button 2221, respectively, and a block 2227 cooperating with the guide slot 2226 is provided on one side of the slider guide 2223.

In the docking state of the second latch 252, the block 2227 engages with the guide slot 2226. When the second frustum 242 is inserted into the central hole 105, the second latch 252 does not contact the outer edge of the central hole 105. When the exposed part of the button 2221 abuts against the magnet protective cover 108, the button 2221 is pressed, compressing the button spring 2225. At the same time, the guide slot 2226 on the button 2221 disengages from the block 2227, unlocking the block 2227. The guide spring 2224 between the two slider guides 2223 rebounds, causing the two slider guides 2223 to drive the two second latches 252 to move in opposite directions. At this time, the device connection module 1 is rotated. When the second latch 252 is opposite to the snap-fit locating socket 106, the second latch 252 is locked into the snap-fit locating socket 106 under the rebound force of the guide spring 2224, thus achieving locking. The mount connection module 2 is the magnetic trigger connection module 202. The magnetic trigger connection module 202 is automatically aligned with the device connection module 1 through magnetic attraction and capable of entering the rotating slot 1031. After entering the rotating slot 1031, the guide spring 2224 is triggered, enabling the mount connection module 2 to rotate 360 degrees arbitrarily relative to the device connection module 1. During the rotation, regardless of rotating clockwise or counterclockwise to any angle, the snap-fit locking mechanism 22 can enter the corresponding snap-fit locating socket 106 to form double-locking combining magnetic attraction and snap-fitting; the magnetic attraction is used for entering the rotating slot 1031.

As shown in FIGS. 1-39, in some embodiments, the second lever linkage mechanism 232 includes a second lever body 2321 and a connecting rod body 2322. The connecting rod body 2322 is rotatably disposed at a bottom of the second upper shell, the second lever body is rotatably disposed at the bottom of the second upper shell 2121. A lever block 2323 is disposed at a rotation position of the second lever body 2321. The lever block 2323 is located on one side of one of the guide pressure rods 2222. One end of the connecting rod body 2322 extends to one side of the other guide pressure rod 2222; the other end of the connecting rod body 2322 extends to one end of the second lever body 2321 and is provided with a return spring 2324. One end of the second lever body 2321 away from the connecting rod body 2322 extends to the outside of the second upper shell 2121 and is provided with a second lever silicone sleeve 2325.

When the second latch 252 needs to be unlocked, by moving one exposed end of the second lever body 2321, the lever block 2323 on the second lever body 2321 abuts against one of the guide pressure rods 2222. One end of the second lever body 2321 deflects against the connecting rod body 2322, and one end of the connecting rod body 2322 compresses the return spring 2324, while the other end of the connecting rod body 2322 abuts against the other guide pressure rod 2222, causing the two guide pressure rods 2222 to move towards each other, which in turn drives the second latches 252 on the two slider guides 2223 to disengage from the snap-fit locating socket 106, so that the device connection module 1 can be removed. In this case, the block 2227 on the slider guide 2223 is opposite to the guide slot 2226. However, since the device connection module 1 is not separated from the second frustum 242, the button 2221 is in the pressed state and cannot engage the guide slot 2226 with the block 2227. After the device connection module 1 is removed, the button 2221 rebounds and extends further out of the second frustum 242, so that the block 2227 is engaged inside the guide slot 2226, ready for the next docking state.

As shown in FIGS. 1-39, in some embodiments, a second pressure plate 2125 is provided inside the second bottom shell 2122, and a plurality of arc-shaped locating slots 2126 are provided at a bottom of the second pressure plate 2125, and the plurality of arc-shaped locating slots 2126 are arranged in a ring shape; a turntable 2127 is rotatably provided inside the second bottom shell 2122, a turntable support 2128 is provided at a top of the turntable 2127, a plurality of beads 21282 are movably provided inside the turntable support 2128 through bead springs 21281, and a top of the bead 21282 extends into the inside of one of the arc-shaped locating slots 2126;

A damping rubber ring 2129 fitting the outside of the turntable 2127 is embedded inside the second bottom shell 2122, a plurality of dustproof nets 21221 are provided inside the second bottom shell 2122 and arranged in a ring shape, a bottom of the turntable 2127 extends to a bottom of the second bottom shell 2122 and is provided with a second mount docking slot 5, and a second copper nut 51 is embedded inside the second mount docking slot 5.

After the device connection module 1 is connected to the mount connection module 2, the device connection module 1 adjusts the angle by rotating the second upper shell 2121 and the second bottom shell 2122. The second bottom shell 2122 drives the plurality of arc-shaped locating slots 2126 on the second pressure plate 2125 to abut against the beads 21282. The beads 21282 compress the bead spring 21281 to rebound and avoid. When the arc-shaped locating slots 2126 are opposite to the beads 21282 again, the beads 21282 are stuck into the inside of the arc-shaped locating slots 2126 under the rebound force of the bead spring 21281, thereby achieving the locating of the angle of the second pressure plate 2125 and achieving 360-degree stepless locating.

As shown in FIGS. 1-39, in some embodiments, the magnetic snap-on intelligent quick connection system further comprises a mount mechanism 6, the mount mechanism 6 includes a vertical adjustment mount 61, a horizontal adjustment mount 62 and a handlebar clamp 63, a top of the vertical adjustment mount 61 is provided with a square platform 64 cooperating with the first mount docking slot 4 or the second mount docking slot 5, one end of the vertical adjustment mount 61 and one end of the horizontal adjustment mount 62 are locked by a first screw 65, and one end of the vertical adjustment mount 61 and one end of the horizontal adjustment mount 62 are provided with mutually meshing gear plates 66, and a bottom of one end of the horizontal adjustment mount 62 away from the vertical adjustment mount 61 is provided with a gear slot 67;

The handlebar clamp includes an upper clamp 631 and a lower clamp 632, the upper clamp 631 and the horizontal adjustment mount 62 are locked by a second screw 68, a top of the upper clamp 631 is provided with a circular protrusion 633 fitting the gear slot 67, and the circular protrusion 633 is provided with a plurality of locking teeth 634 meshing with the gear slot 67;

One end of the lower clamp 632 is hinged to one end of the upper clamp 631 by a pivot, and the other end of the lower clamp 632 and the other end of the upper clamp 631 are locked by a third screw 69, and an inner liner 635 is provided between the upper clamp 631 and the lower clamp 632.

The upper clamp 631 and the lower clamp 632 are fixed to the handlebars of a bicycle or motorcycle by the inner liner 635, which can prevent wear on the handlebars. By loosening the second screw 68, the relative angle between the upper clamp 631 and the horizontal adjustment mount 62 can be adjusted. After adjustment, the second screw 68 can be tightened again. Multiple locking teeth 634 mesh with the gear slot 67 to ensure the stability after angle adjustment. Loosening the first screw 65 can adjust the relative angle between the horizontal adjustment mount 62 and the vertical adjustment mount 61. After adjustment, the first screw 65 can be tightened again. The two gear plates 66 mesh with each other to ensure the stability after angle adjustment.

The first mount docking slot 4 and the second mount docking slot 5 have the same structure. After the square platform 64 at one end of the vertical adjustment mount 61 is inserted into the first mount docking slot 4 or the second mount docking slot 5, it can be screwed into the first copper nut 41 or the second copper nut 51 by threading screws.

In summary, great convenience is achieved by using a complete circular docking system formed by the circular base 101, the circular mounting slot 104, and the circular central hole 105 of the device connection module 1, and the circular device 21 and the frustum 24 of the mount connection module 2, eliminating the need for precise angle matching during magnetic alignment. The annular magnet array 102 and corresponding magnet groups generate uniform attraction at any angle, allowing the frustum 24 to automatically align and insert into the central hole 105. Then the latches 25 accurately dock with the snap-fit locating slots 106 to lock in place by 360-degree arbitrary rotation. The circular design makes operation intuitive and quick, and guarantees uniform and stable force distribution at the connection interface. Combined with the wear-resistant material and optimized magnetic circuit of the quick-release fastener 103, it comprehensively improves the alignment efficiency, mechanical strength, and service life of the connection system.

Finally, it should be noted that the above descriptions are merely preferred embodiments of the present disclosure and are not intended to limit the present disclosure. Although the present disclosure has been described in detail with reference to the foregoing embodiments, those skilled in the art can still modify the technical solutions described in the foregoing embodiments or make equivalent substitutions for some of the technical features. Any modifications, equivalent substitutions, improvements, etc., made within the spirit and principles of the present disclosure should be included within the protection scope of the present disclosure.

The invention claimed is:

1. A magnetic snap-on intelligent quick connection system, comprising:

a device connection module including a circular base, an annular magnet array, and a quick-release fastener; wherein the base is provided with a circular mounting slot, the annular magnet array is fixed in the mounting slot, the quick-release fastener is fixed in the middle of the mounting slot, the quick-release fastener is provided with a circular central hole, circumferentially distributed snap-fit locating sockets, and circumferentially distributed rotating slots, the snap-fit locating sockets being located at two horizontal ends of the rotating slots;

a mount connection module including a circular device, a snap-fit locking mechanism, and a lever linkage mechanism; wherein a top of the circular device is provided with a frustum capable of being inserted into the central hole, the snap-fit locking mechanism includes two latches movably disposed in the circular device and capable of partially extending out of a side of the frustum, the lever linkage mechanism is connected to the latches;

the device connection module and the mount connection module are magnetically attracted to insert the frustum into the central hole and enable the device connection module to rotate 360 degrees arbitrarily relative to the mount connection module; when the latches are aligned with the snap-fit locating sockets, the latches are engaged to achieve mechanical locking; the lever linkage mechanism is capable of being operated to drive the latches to disengage from the latch locating sockets to achieve disassembly.

2. The magnetic snap-on intelligent quick connection system according to claim 1, wherein the mounting slot of the base includes an outer ring slot and an inner ring slot which are concentric; the annular magnet array is embedded in the outer ring slot;

the quick-release fastener is embedded in the inner ring slot, and a foolproof structure is provided between the quick-release fastener and the inner ring slot to limit a circumferential assembly angle of the quick-release fastener.

3. The magnetic snap-on intelligent quick connection system according to claim 1, wherein the device connection module further includes an annular magnet fixing latch and a magnet protective cover; the annular magnet fixing latch is disposed on a side of the annular magnet array away from the base;

the magnet protective cover fixedly covers the base and encapsulates the annular magnet fixing latch and the quick-release fastener;

the magnet protective cover is fixed to the base by any means of snap-fitting, ultrasonic welding, or adhesive bonding.

4. The magnetic snap-on intelligent quick connection system according to claim 3, wherein the base is adapted to a non-circular terminal device and has an obround shape; the annular magnet array is composed of two sets of C-shaped magnets arranged opposite each other; an outer edge of the magnet protective cover is provided with symmetrical notches to make its shape consistent with the base; the non-circular terminal device is an action camera provided with an obround base for mounting the base.

5. The magnetic snap-on intelligent quick connection system according to claim 1, wherein the base is an independent circular base, and the circular base is attached to a surface of a terminal device by an adhesive backing structure;

the adhesive backing structure includes a perforated SM adhesive, a PET film, and a disc-type 3M adhesive laminated in sequence.

6. The magnetic snap-on intelligent quick connection system according to claim 1, wherein the base is a component of a protective shell; the protective shell includes a bottom shell and a silicone outer shell, the bottom shell of the protective shell extends to a back of the silicone outer shell to form an annular boss, an inner cavity of the annular boss forms the mounting slot of the base; the protective shell is a mobile phone protective shell or a tablet computer protective shell.

7. The magnetic snap-on intelligent quick connection system according to claim 6, wherein a buffer layer is provided on a side of the bottom shell facing the terminal device, and the buffer layer is felt or an embedded sponge block.

8. The magnetic snap-on intelligent quick connection system according to claim 1, wherein the base is a mounting structure directly formed on a terminal device body; the terminal device is a motorcycle infotainment system or a UAV remote controller.

9. The magnetic snap-on intelligent quick connection system according to claim 1, wherein the quick-release fastener is made of a ceramic or metal material or engineering plastic, and magnets of the annular magnet array are arranged with alternating polarities to enhance magnetic attraction force.

10. The magnetic snap-on intelligent quick connection system according to claim 1, wherein an intelligent safety system is integrated in the mount connection module, and the intelligent safety system includes:

a main control chip;

a gyroscope sensing module electrically connected to the main control chip and configured to detect a tilt angle of a device and generate tilt data;

a tilt alarm device electrically connected to the main control chip and configured to receive an alarm signal from the main control chip and issue a warning;

a GPS sensing module electrically connected to the main control chip and configured to receive a satellite signal to calculate precise position and speed data of the device;

a wireless communication module electrically connected to the main control chip and configured to send the position data, the speed data and device status information to a remote monitoring platform or a preset mobile terminal via a wireless network;

a power management module electrically connected to the main control chip and configured to receive external ACC power and supply power to each module; wherein the main control chip is configured to receive and process the tilt data from the gyroscope sensing module, drive the tilt alarm device to issue an alarm when the tilt angle exceeds a preset threshold; and receive position data from the GPS sensing module and send out an alarm signal containing position information through the wireless communication module.

11. The magnetic snap-on intelligent quick connection system according to claim 1, wherein the mount connection module is a magnetic press-fit connection module which is automatically aligned with the device connection module through magnetic attraction; by pressing and extending the snap-fit locking mechanism, the latches enter the rotating slots and achieve 360-degree arbitrary rotation; during the rotation, regardless of rotating clockwise or counterclockwise to any angle, the snap-fit locking mechanism is capable of entering the corresponding snap-fit locating socket to form double-locking combining magnetic attraction and snap-fitting;

the circular device is a first circular device, and a first frustum is provided on a top of the first circular device;

the snap-fit locking mechanism is a first snap-fit locking mechanism;

the lever linkage mechanism is a first lever linkage mechanism.

12. The magnetic snap-on intelligent quick connection system according to claim 11, wherein the first circular device includes a first upper shell, a first middle shell, and a first bottom shell arranged from top to bottom in sequence; the first frustum is bonded to a top of the first upper shell, a wireless charging control board is provided in the first middle shell, a wireless charging coil is integrated on a top of the wireless charging control board, a through hole is provided in the first middle shell, the wireless charging control board, the wireless charging coil, and the first upper shell, respectively, a waterproof sleeve is provided in the through hole of the first middle shell and the through hole of the wireless charging control board, a waterproof ring is provided between the first upper shell and the first middle shell, and a first decorative ring is embedded on the top of the first upper shell.

13. The magnetic snap-on intelligent quick connection system according to claim 12, wherein a first annular magnet group magnetically engaged with the annular magnet array is embedded in the first upper shell, the first snap-fit locking mechanism includes two first latches symmetrically hinged to a bottom of the first middle shell through a fixing shaft, a torsion spring sleeves the fixing shaft, one end of the first latch away from the fixing shaft penetrates through a plurality of through holes and extends to a side portion of the first frustum, and a ramp located on one side of the fixing shaft is provided on one side of the first latch;

the magnetic press-fit connection module is automatically aligned with the device connection module through magnetic attraction; by pressing and extending the snap-fit locking mechanism, the latches enter the rotating slots through the torsion spring and achieve 360-degree arbitrary rotation; during the rotation, regardless of rotating clockwise or counterclockwise to any angle, the snap-fit locking mechanism is capable of entering the corresponding snap-fit locating socket to form double-locking combining magnetic attraction and snap-fitting;

a notch is provided on one side of the first bottom shell, and a power cord with one end penetrating through the first middle shell and emerging from the notch is integrated at a bottom of the wireless charging control board, a sealing ring is provided between the power cord and the first middle shell;

the first lever linkage mechanism includes a first lever body and a U-shaped slider, the U-shaped slider is slidably disposed at the bottom of the first middle shell by a slider spring, bottoms of two ends of the U-shaped slider are inclined surfaces and are respectively opposite to two ramps, the first lever body is rotatably disposed at the bottom of the first middle shell, one end of the first lever body flexibly contacts one side of the U-shaped slider, and the other end of the first lever body extends to the outside of the first middle shell and is provided with a first lever silicone sleeve.

14. The magnetic snap-on intelligent quick connection system according to claim 13, wherein a first pressure plate located below the U-shaped slider and the first lever body is provided at the bottom of the first middle shell, a gear is rotatably provided at a middle position inside the first bottom shell, two transmission gear blocks are symmetrically arranged inside the first bottom shell, one side of the transmission gear block meshes with the gear, and the other side of the transmission gear block is provided with a gear block spring, a damping sealing gasket is embedded in the inside and the bottom of the first bottom shell, respectively, the damping sealing gasket located inside the first bottom shell contacts a bottom of the gear, and a bottom end of the gear extends to the bottom of the first bottom shell and is provided with an obround docking platform.

15. The magnetic snap-on intelligent quick connection system according to claim 14, wherein a shock-absorbing mechanism is provided at a bottom of the first circular device, the shock-absorbing mechanism includes a shock-absorbing upper shell and a shock-absorbing lower shell, a slide slot cooperating with the obround docking platform is provided in the shock-absorbing upper shell, a shock-absorbing slide tenon is movably provided at one end of the slide slot, a locating block is provided between the slide slot and the shock-absorbing slide tenon, a plurality of shock-absorbing limiting screws with one end screwed into the inside of the shock-absorbing upper shell are provided inside the shock-absorbing lower shell, a pagoda-shaped shock-absorbing spring sleeves the shock-absorbing limiting screw, a first mount docking slot is provided at a bottom of the shock-absorbing lower shell, and a first copper nut is embedded inside the first mount docking slot.

16. The magnetic snap-on intelligent quick connection system according to claim 1, wherein the mount connection module is a magnetic trigger connection module which is automatically aligned with the device connection module through magnetic attraction and capable of entering the rotating slot; after entering the rotating slot, the snap-fit locking mechanism is triggered, enabling the mount connection module to rotate 360 degrees arbitrarily relative to the device connection module; during the rotation, regardless of rotating clockwise or counterclockwise to any angle, the snap-fit locking mechanism is capable of entering the corresponding snap-fit locating socket to form double-locking combining magnetic attraction and snap-fitting;

the circular device is a second circular device, and a second frustum is provided on a top of the second circular device;

the snap-fit locking mechanism is a second snap-fit locking mechanism;

the lever linkage mechanism is a second lever linkage mechanism.

17. The magnetic snap-on intelligent quick connection system according to claim 16, wherein the second circular device includes a second upper shell and a second bottom shell, the second frustum and a top of the second upper shell are integrally formed, a second annular magnet group magnetically engaged with the annular magnet array is embedded inside the second upper shell, and a second decorative ring is embedded in the top of the second upper shell;

the second snap-fit locking mechanism includes a button and two guide pressure rods symmetrically arranged on two sides of the button, a slider guide is provided on a top of the guide pressure rod, a guide spring is provided between the two slider guides, a second latch is provided on a top of the slider guide, one end of the second latch away from the slider guide extends to a side portion of the second frustum;

the magnetic trigger connection module is automatically aligned with the device connection module through magnetic attraction and capable of entering the rotating slot; after entering the rotating slot, the guide spring is triggered, enabling the mount connection module to rotate 360 degrees arbitrarily relative to the device connection module; during the rotation, regardless of rotating clockwise or counterclockwise to any angle, the snap-fit locking mechanism is capable of entering the corresponding latch locating socket to form double-locking combining magnetic attraction and snap-fitting;

a top of the button extends to a top of the second frustum, a bottom of the button is provided with a button spring, and a guide slot is provided on two sides of the bottom of the button, respectively, and a block cooperating with the guide slot is provided on one side of the slider guide.

18. The magnetic snap-on intelligent quick connection system according to claim 17, wherein the second lever linkage mechanism includes a second lever body and a connecting rod body, the connecting rod body is rotatably disposed at a bottom of the second upper shell, the second lever body is rotatably disposed at the bottom of the second upper shell, a lever block is disposed at a rotation position of the second lever body, the lever block is located on one side of one of the guide pressure rods, one end of the connecting rod body extends to one side of the other guide pressure rod; the other end of the connecting rod body extends to one end of the second lever body and is provided with a return spring, and one end of the second lever body away from the connecting rod body extends to the outside of the second upper shell and is provided with a second lever silicone sleeve.

19. The magnetic snap-on intelligent quick connection system according to claim 18, wherein a second pressure plate is provided inside the second bottom shell, and a plurality of arc-shaped locating slots are provided at a bottom of the second pressure plate, and the plurality of arc-shaped locating slots are arranged in a ring shape; a turntable is rotatably provided inside the second bottom shell, a turntable support is provided at a top of the turntable, a plurality of beads are movably provided inside the turntable support through bead springs, and a top of the bead extends into the inside of one of the arc-shaped locating slots;

a damping rubber ring fitting the outside of the turntable is embedded inside the second bottom shell, a plurality of dustproof nets are provided inside the second bottom shell and arranged in a ring shape, a bottom of the turntable extends to a bottom of the second bottom shell and is provided with a second mount docking slot, and a second copper nut is embedded inside the second mount docking slot.

20. The magnetic snap-on intelligent quick connection system according to claim 1, further comprising a mount mechanism, wherein the mount mechanism includes a vertical adjustment mount, a horizontal adjustment mount and a handlebar clamp, a top of the vertical adjustment mount is provided with a square platform cooperating with the first mount docking slot or the second mount docking slot, one end of the vertical adjustment mount and one end of the horizontal adjustment mount are locked by a first screw, and one end of the vertical adjustment mount and one end of the horizontal adjustment mount are provided with mutually meshing gear plates, and a bottom of one end of the horizontal adjustment mount away from the vertical adjustment mount is provided with a gear slot;

the handlebar clamp includes an upper clamp and a lower clamp, the upper clamp and the horizontal adjustment mount are locked by a second screw, a top of the upper clamp is provided with a circular protrusion fitting the gear slot, and the circular protrusion is provided with a plurality of locking teeth meshing with the gear slot;

one end of the lower clamp is hinged to one end of the upper clamp by a pivot, and the other end of the lower clamp and the other end of the upper clamp are locked by a third screw, and an inner liner is provided between the upper clamp and the lower clamp.

21. The magnetic snap-on intelligent quick connection system according to claim 1, wherein:

the snap-fit locating socket is configured to lock the device connection module and the mount connection module;

the rotating slot is configured to guide the rotation of the mount connection module, enabling the system to lock in a plurality of horizontal directions;

the layout facilitates lever unlocking operation of the lever linkage mechanism and conforms to ergonomic principles, allowing an operator to complete unlocking and disassembly with one hand.

* * * * *